United States Patent
Ueda et al.

(10) Patent No.: US 7,507,039 B2
(45) Date of Patent: Mar. 24, 2009

(54) DYNAMIC PRESSURE BEARING MANUFACTURING METHOD, DYNAMIC PRESSURE BEARING AND DYNAMIC PRESSURE BEARING MANUFACTURING DEVICE

(75) Inventors: Masanori Ueda, Kawasaki (JP); Haruyuki Matsunaga, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/924,933

(22) Filed: Aug. 25, 2004

(65) Prior Publication Data
US 2005/0025403 A1    Feb. 3, 2005

Related U.S. Application Data

(63) Continuation of application No. PCT/JP03/02240, filed on Feb. 27, 2003.

(30) Foreign Application Priority Data
Feb. 28, 2002    (JP)    ............................. 2002-054746

(51) Int. Cl.
*F16C 32/06*    (2006.01)
*F16C 33/00*    (2006.01)
*B21D 53/00*    (2006.01)

(52) U.S. Cl. ..................... 384/112; 384/115; 29/898.02

(58) Field of Classification Search ................. 384/107, 384/112, 113, 115, 123, 100, 118, 120, 114; 29/852, 898.02; 257/72, 79–86, 291, 252, 257/258; 174/35 MS, 35 R; 438/149, 153–159, 438/424
See application file for complete search history.

(56) References Cited

U.S. PATENT DOCUMENTS

| | | | | | |
|---|---|---|---|---|---|
| 4,877,818 | A | * | 10/1989 | Emmons et al. | 522/26 |
| 5,814,836 | A | * | 9/1998 | Hyun | 257/79 |
| 5,997,180 | A | * | 12/1999 | Ishizuka et al. | 384/115 |
| 6,104,042 | A | * | 8/2000 | Sah | 257/59 |

(Continued)

FOREIGN PATENT DOCUMENTS

JP    53-86650    7/1978

(Continued)

OTHER PUBLICATIONS

Chinese Office Action dated Nov. 3, 2007 for corresponding Chinese Patent Application No. 03804721.7.

(Continued)

*Primary Examiner*—Marcus Charles
(74) *Attorney, Agent, or Firm*—Staas & Halsey LLP

(57) ABSTRACT

A dynamic pressure bearing manufacturing method, comprising the steps of forming a herringbone groove pattern on the outer peripheral surface of a cylindrical mask and a spiral groove pattern on the lower surface of the flange part thereof, inserting the mask in a dynamic pressure bearing and optical fibers into the mask, radiating light from an external light source to the mask through optical fibers to transfer the herringbone groove pattern onto the inner peripheral surface of the dynamic pressure bearing and, at the same time, radiating the light from the upper side of the flange part to transfer the spiral groove pattern onto the upper surface of the dynamic pressure bearing performing development, and forming a herringbone groove on the inner peripheral surface of the bearing by etching and a spiral groove on the upper surface thereof.

1 Claim, 31 Drawing Sheets

U.S. PATENT DOCUMENTS

| | | | |
|---|---|---|---|
| 6,218,219 B1 * | 4/2001 | Yamazaki et al. | 438/149 |
| 6,448,492 B1 * | 9/2002 | Okada et al. | 174/389 |
| 6,465,285 B2 * | 10/2002 | Tokuhiro et al. | 438/153 |
| 6,702,408 B1 * | 3/2004 | Nagarathnam et al. | 384/112 |
| 7,045,835 B2 * | 5/2006 | Layman et al. | 257/258 |
| 2001/0000073 A1 * | 3/2001 | Kobayashi et al. | 384/100 |
| 2001/0042291 A1 * | 11/2001 | Esashi et al. | 29/852 |
| 2002/0090769 A1 * | 7/2002 | Tokuhiro et al. | 438/153 |

FOREIGN PATENT DOCUMENTS

| | | |
|---|---|---|
| JP | 53-115630 | 9/1978 |
| JP | 54-16451 | 6/1979 |
| JP | 57-54274 | 3/1982 |
| JP | 57-054274 | 3/1982 |
| JP | 57-70276 | 4/1982 |
| JP | 57099643 A * | 6/1982 |
| JP | 60014734 A * | 1/1985 |
| JP | 61-12882 | 1/1986 |
| JP | 61-012882 | 1/1986 |
| JP | 61-130490 | 6/1986 |
| JP | 63103087 A * | 5/1988 |
| JP | 05249649 A * | 9/1993 |
| JP | 09005729 A * | 1/1997 |
| JP | 09-316666 | 12/1997 |
| JP | 9-316666 | 12/1997 |
| JP | 09326475 A * | 12/1997 |
| JP | 2000-117375 | 4/2000 |
| JP | 2001082482 A * | 3/2001 |
| JP | 2001-100427 | 4/2001 |

OTHER PUBLICATIONS

Communication (Notice of Rejection Grounds) mailed Apr. 24, 2007.

Chinese Office Action Dated Jul. 6, 2007 for Corresponding Chinese Patent Application No. 03804721.7.

* cited by examiner

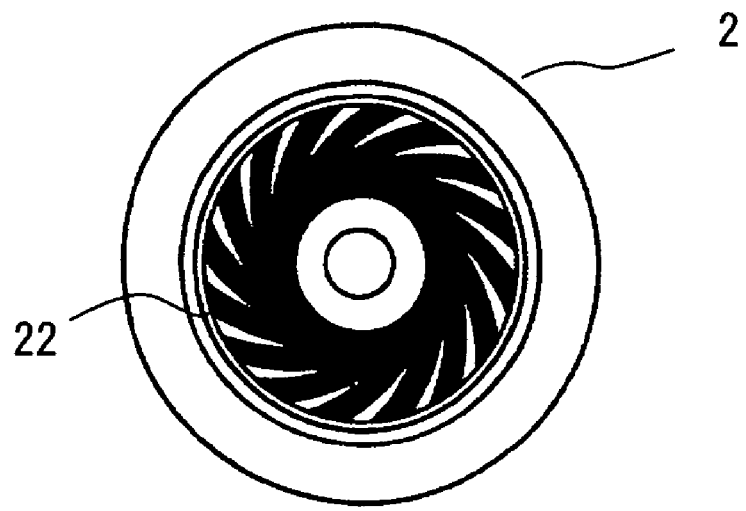
F I G. 1 A
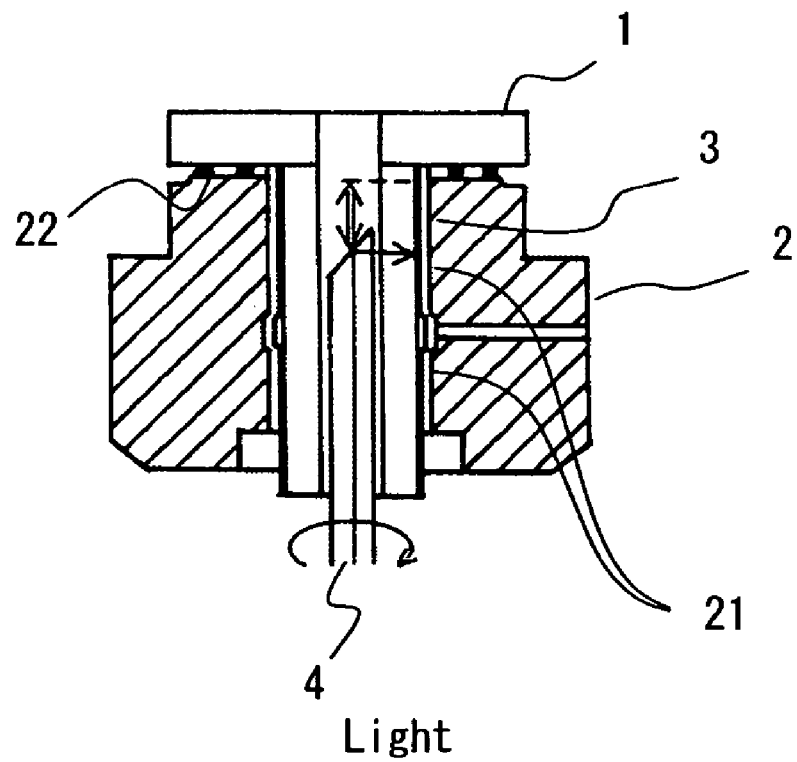
Light
F I G. 1 B

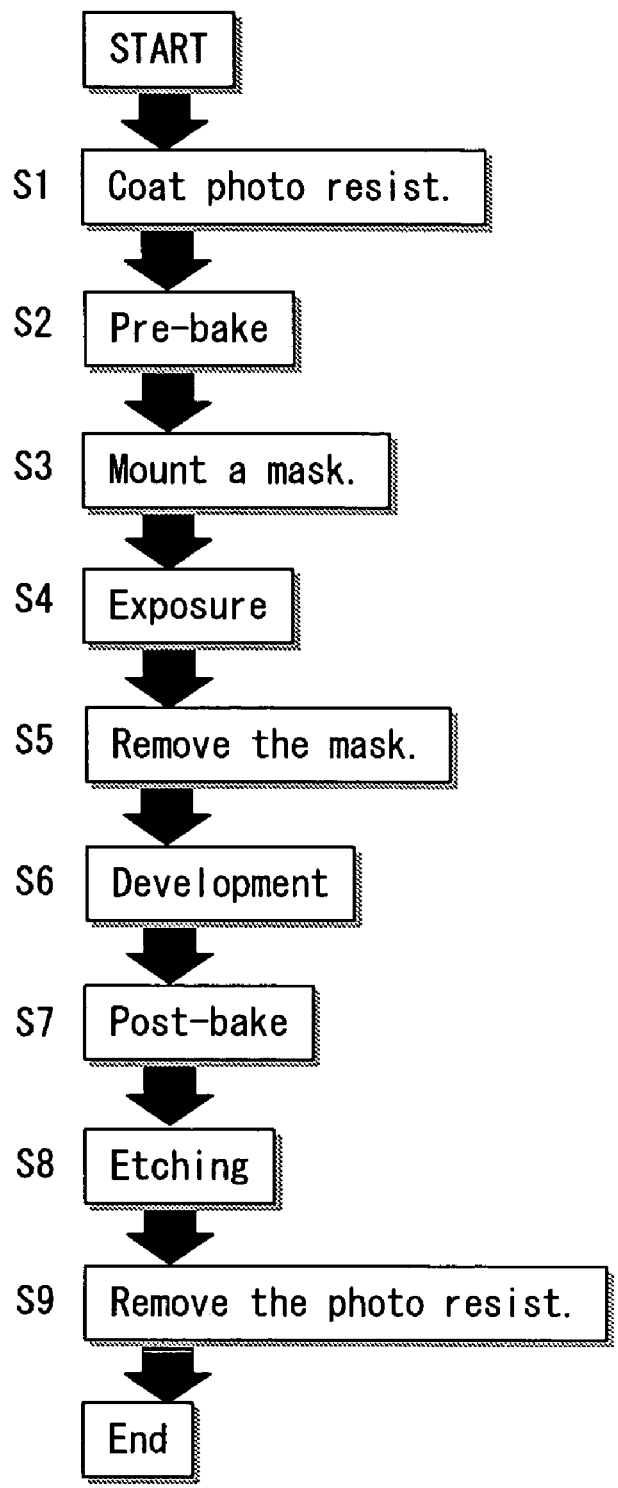
F I G. 2

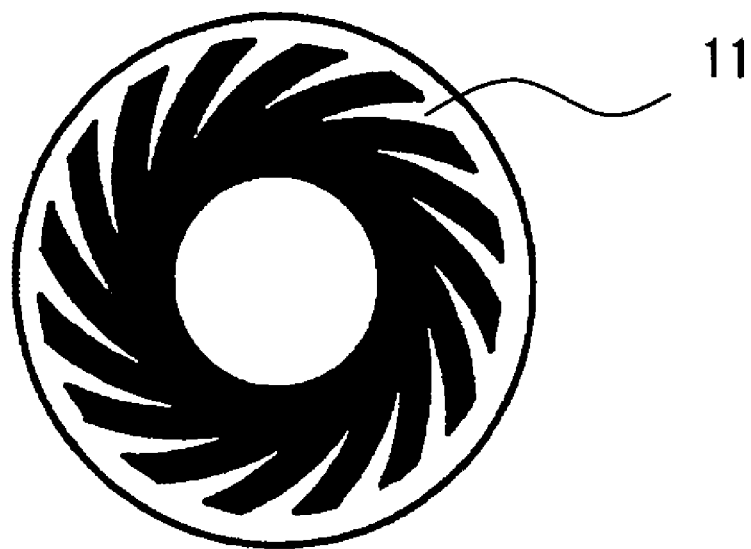
F I G. 3 A
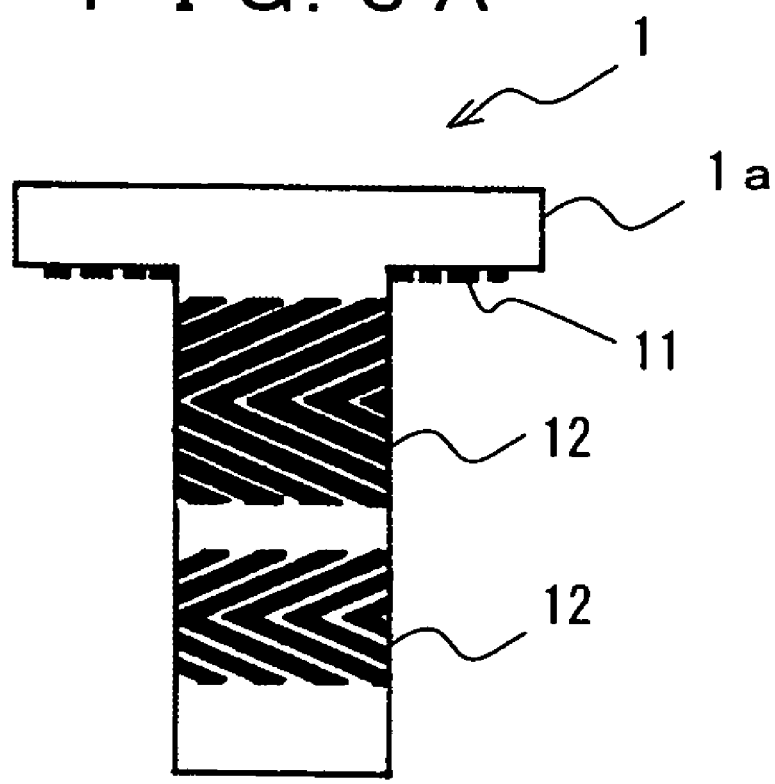
F I G. 3 B

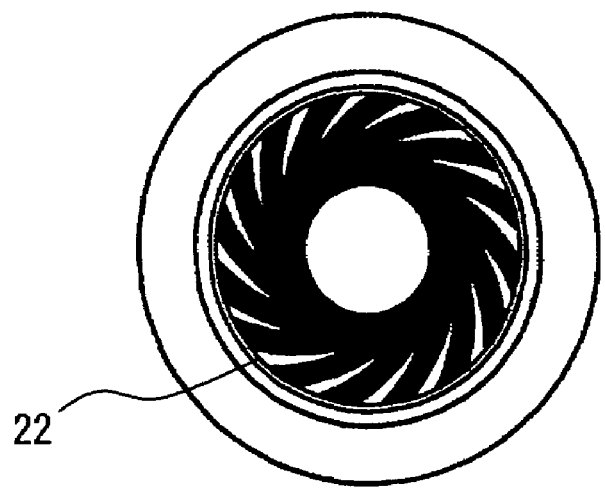
F I G. 4 A
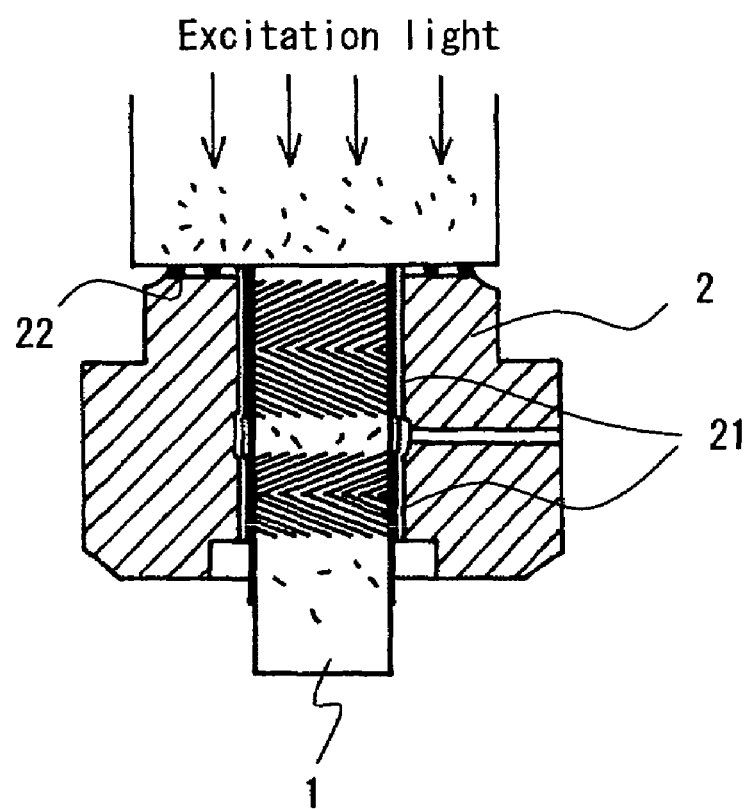
F I G. 4 B

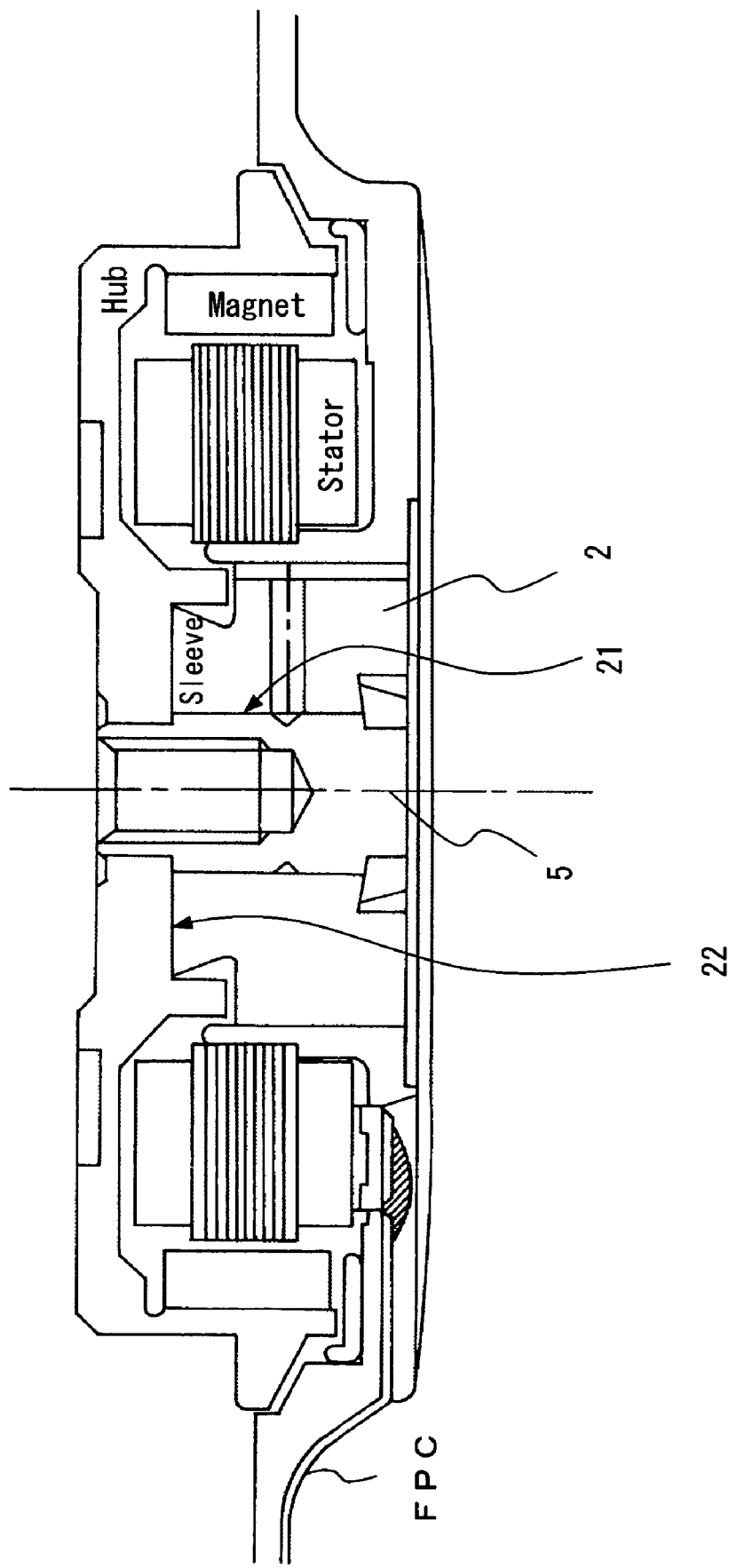
F I G. 5

Light

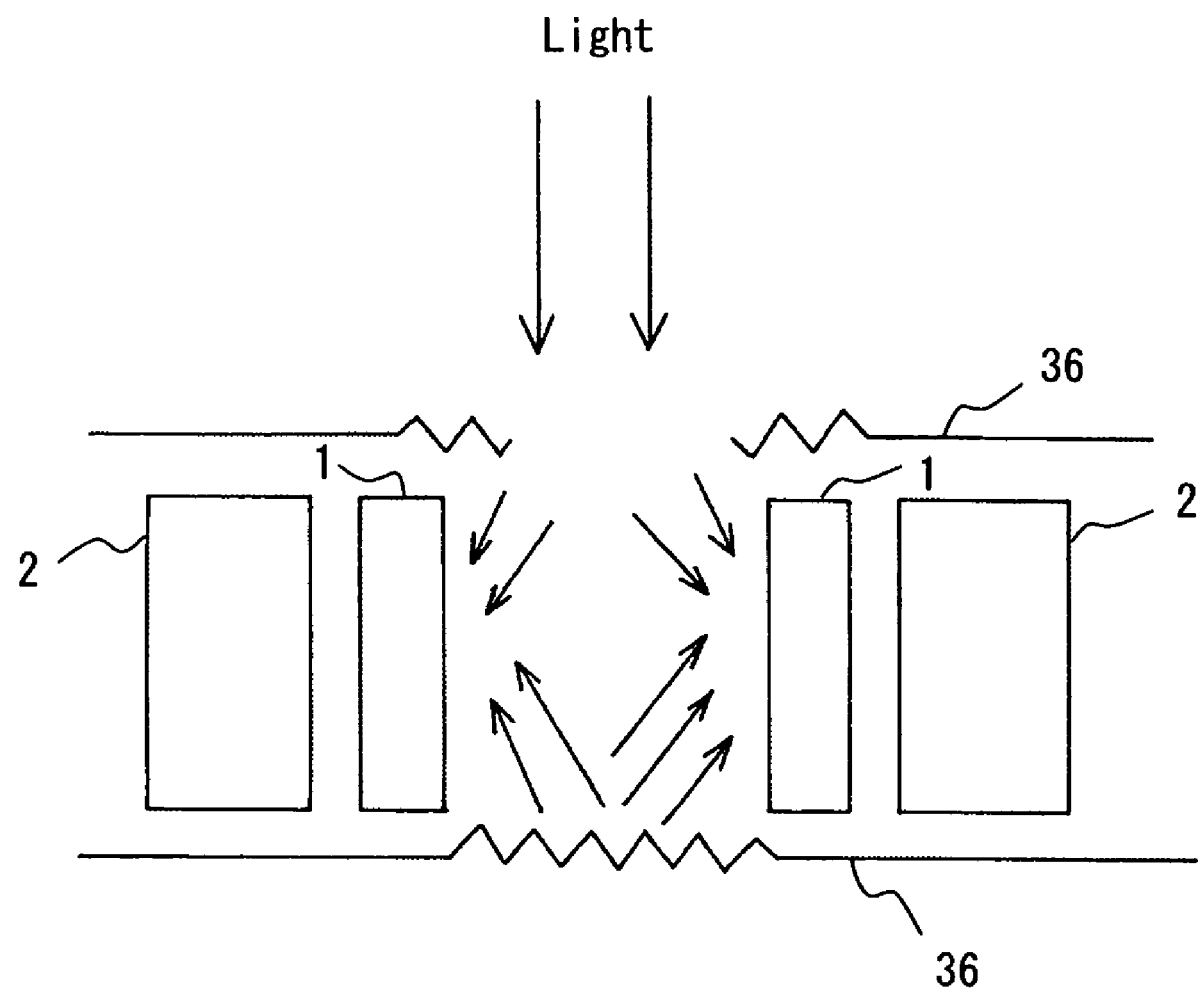
F I G. 1 1

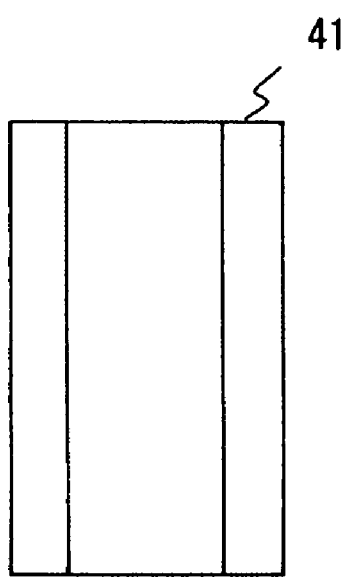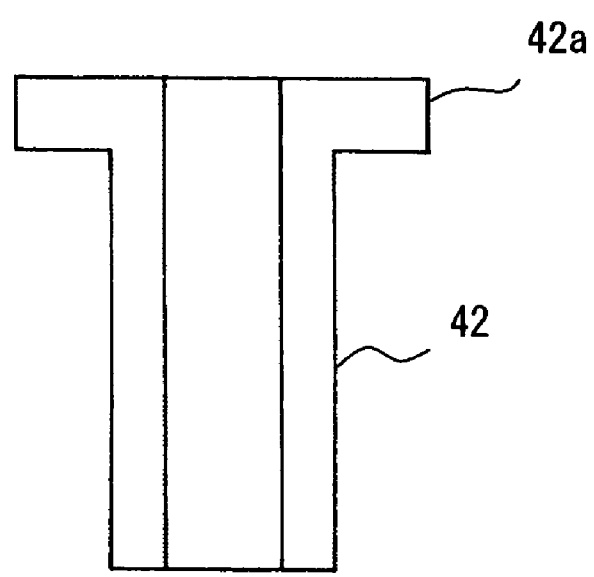
F I G. 1 2 A    F I G. 1 2 B

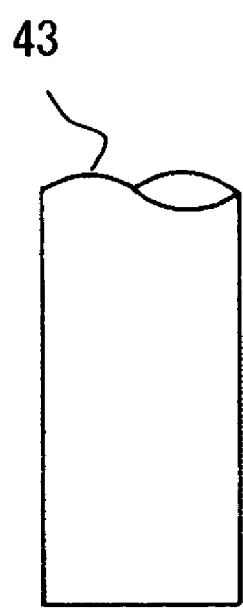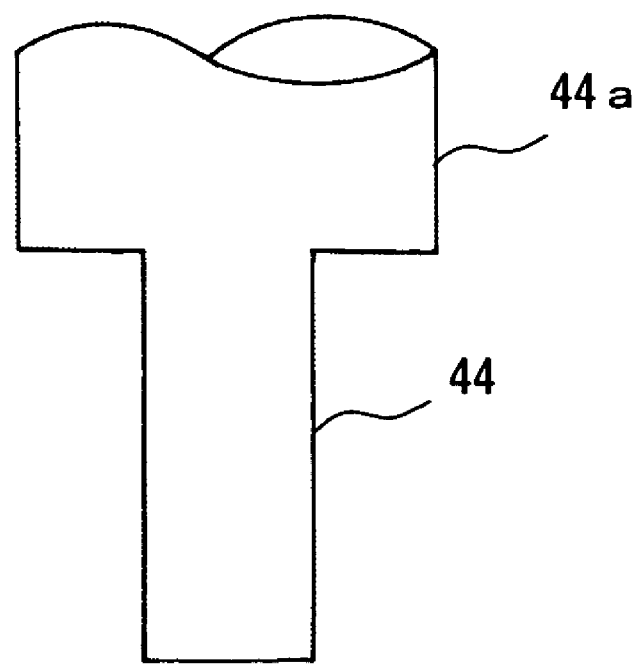
F I G. 1 3 A     F I G. 1 3 B

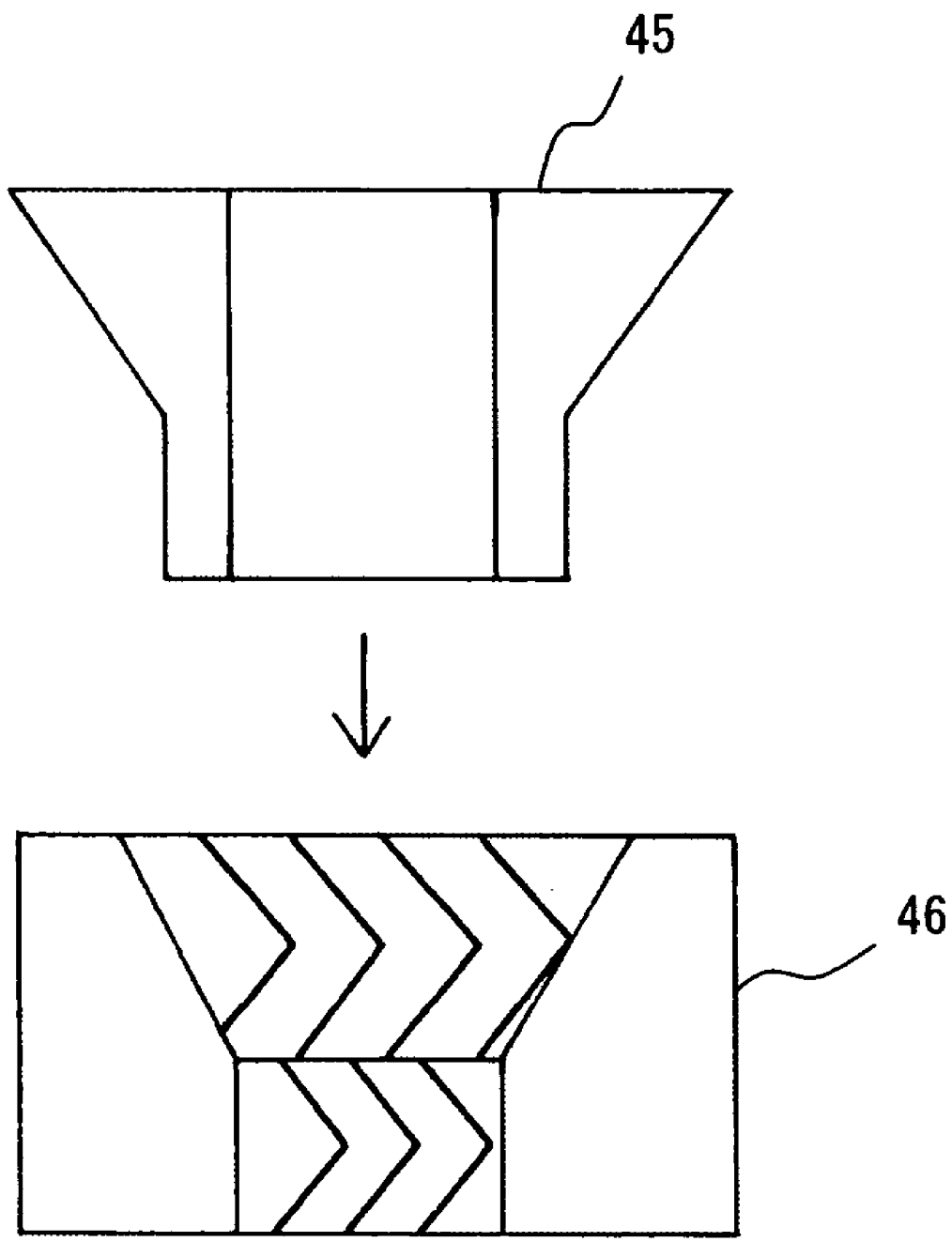
F I G. 1 4

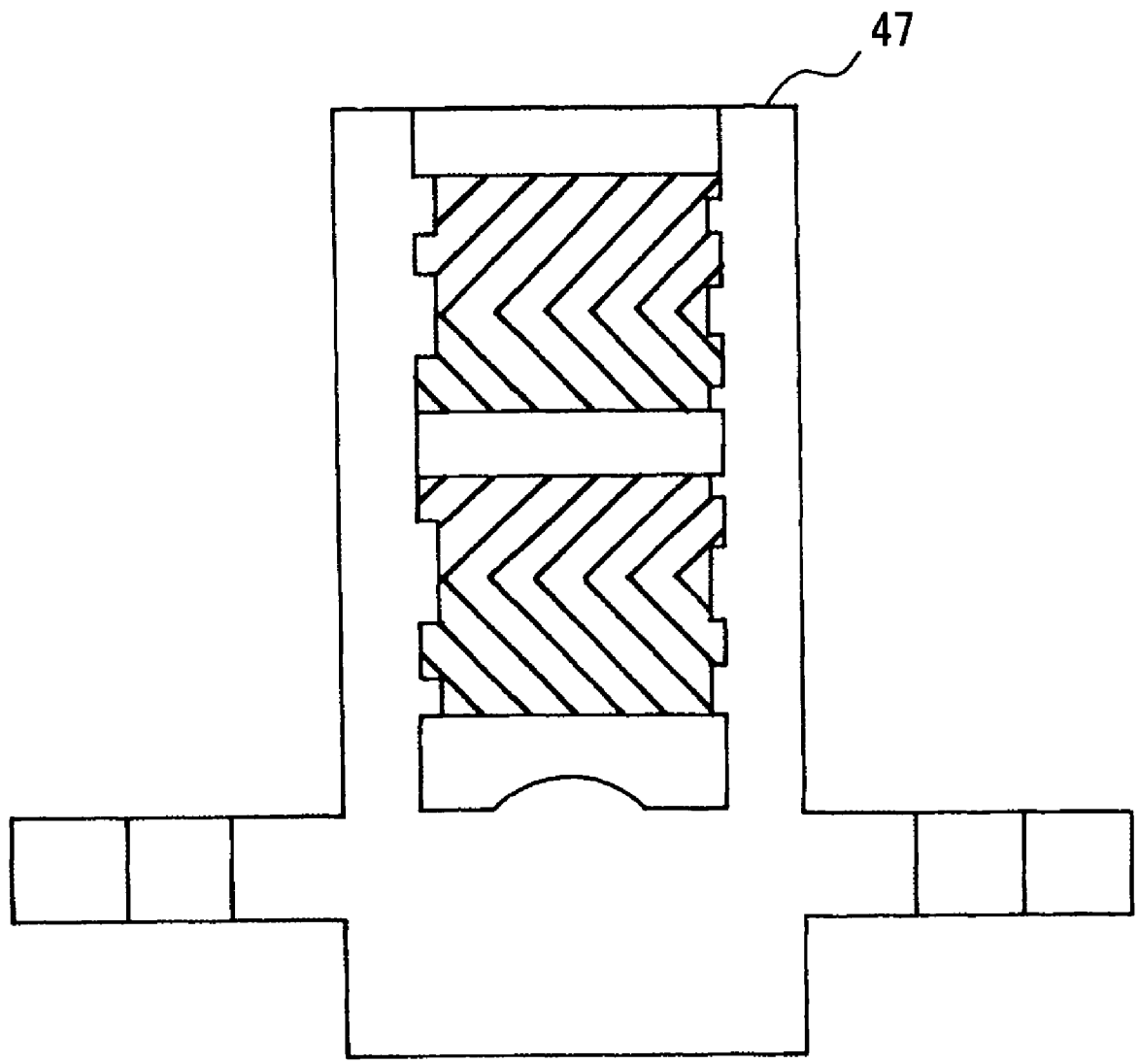
F I G. 1 5

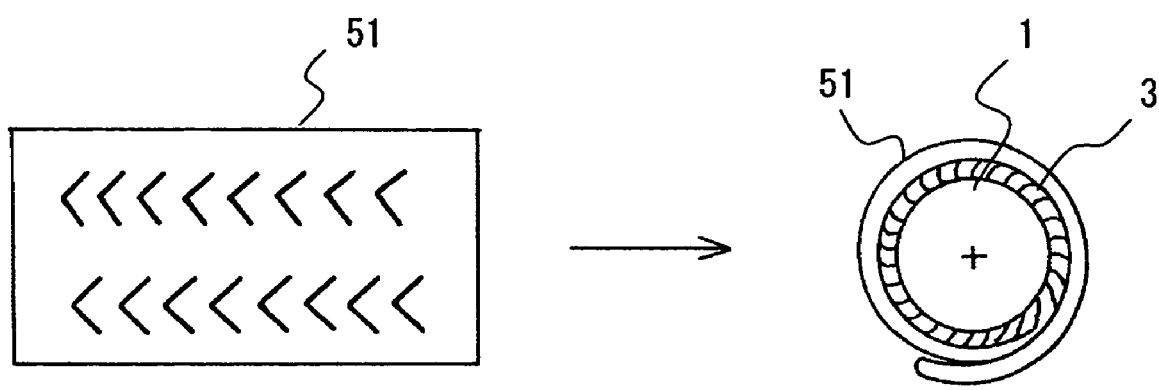
F I G. 1 6

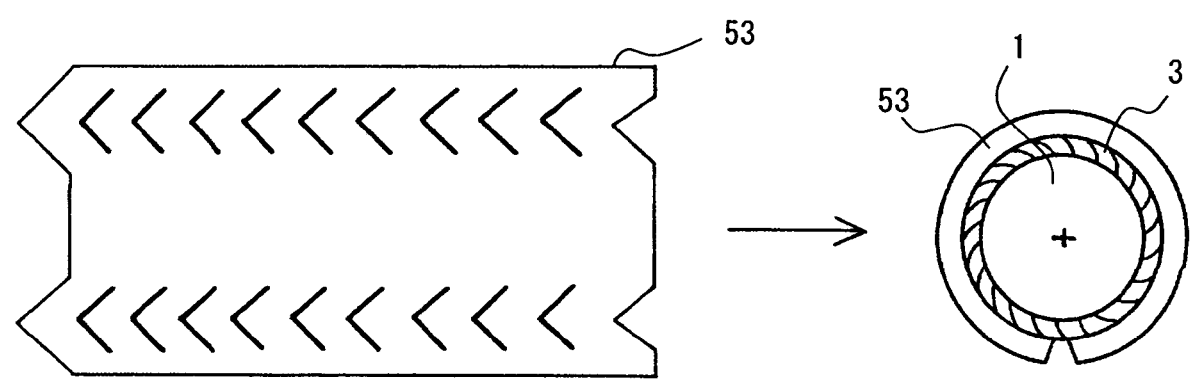
F I G. 1 8

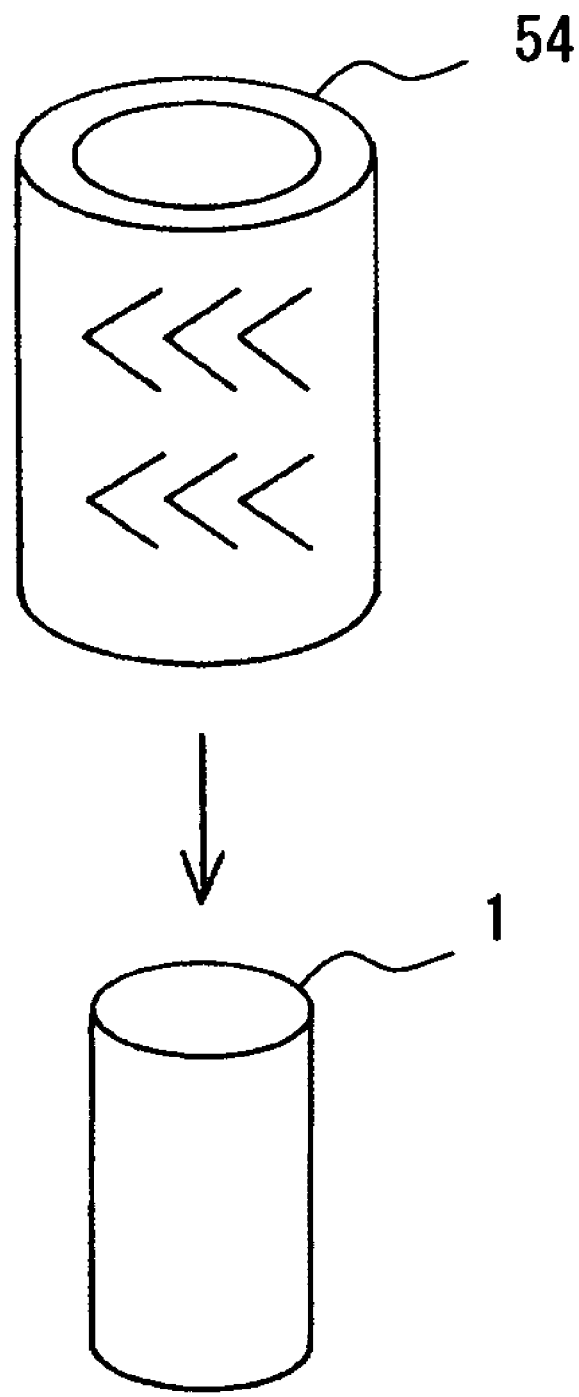
F I G. 1 9

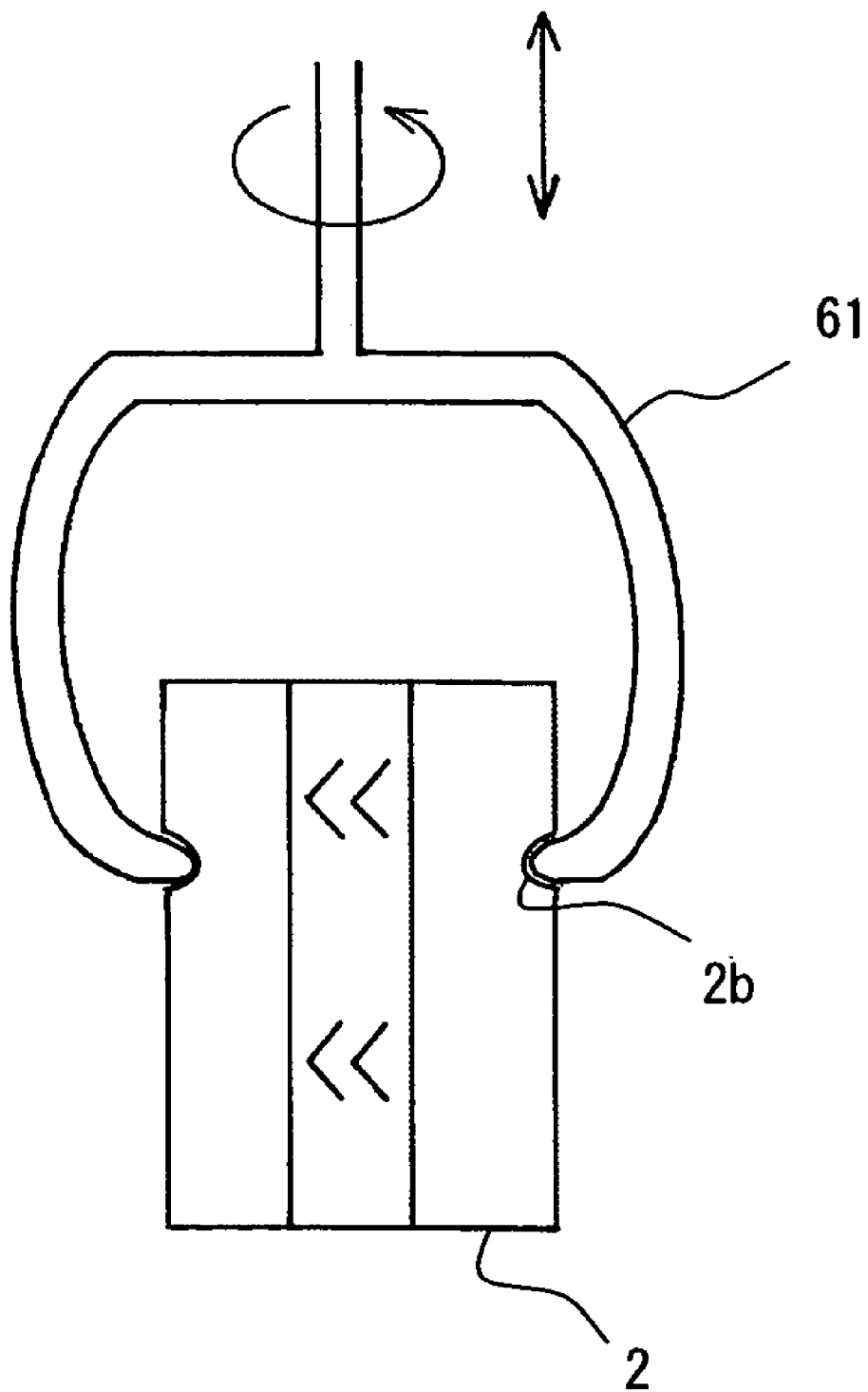
F I G. 2 3

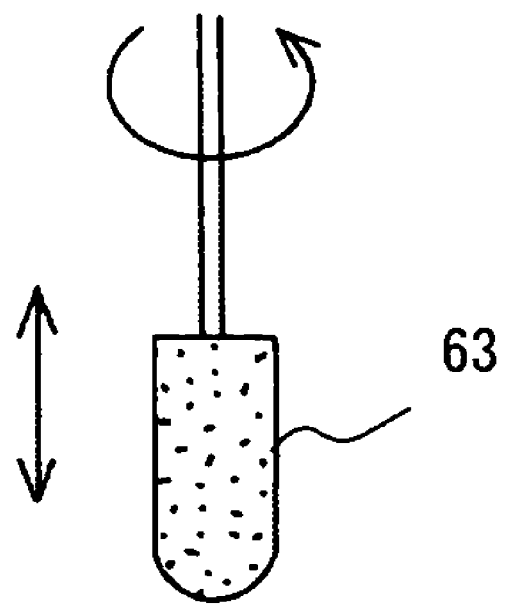
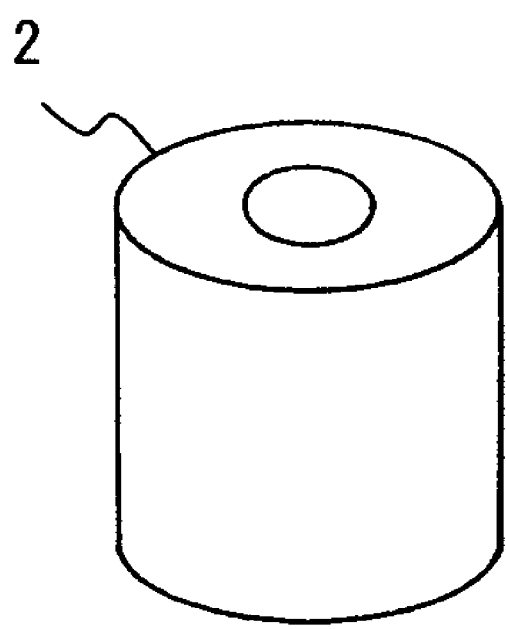
FIG. 25

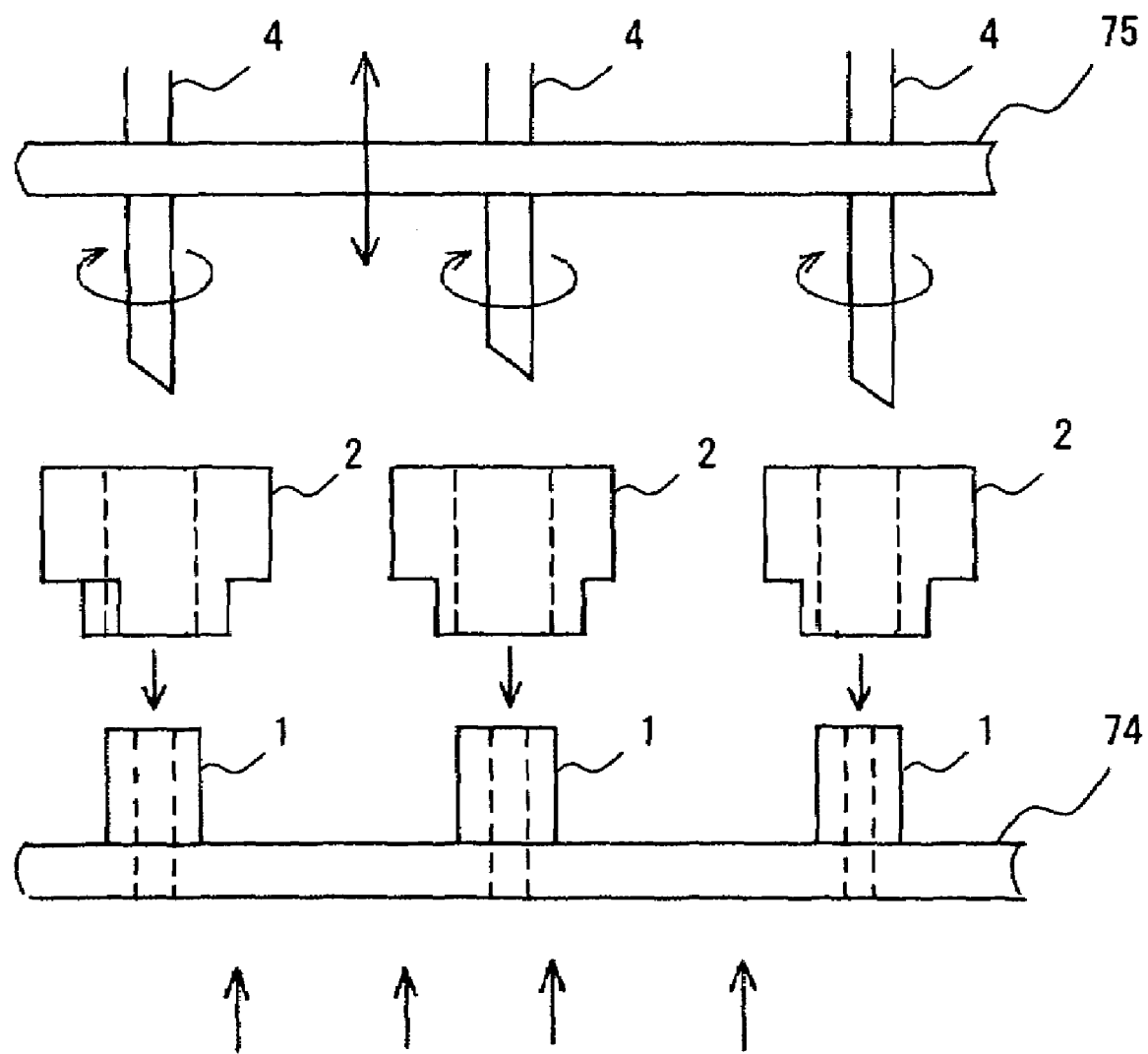
F I G. 29

DYNAMIC PRESSURE BEARING MANUFACTURING METHOD, DYNAMIC PRESSURE BEARING AND DYNAMIC PRESSURE BEARING MANUFACTURING DEVICE

CROSS REFERENCE TO RELATED APPLICATION

This application is a continuation of international PCT application NO. PCT/JP03/02240 filed on Feb. 27, 2003.

BACKGROUND OF THE INVENTION

1. Field of the Invention

The present invention relates to a dynamic pressure bearing manufacturing method for forming a dynamic pressure generating groove on the inner surface of the dynamic pressure bearing, a dynamic pressure bearing manufactured thereby and a dynamic pressure bearing manufacturing device.

2. Description of the Related Art

Recently a dynamic pressure bearing has become used for a spindle motor used for hard disk devices and the like.

A herringbone groove is formed on the inner surface of this dynamic pressure bearing. When a shaft is rotated, lubricating oil is compressed along the herringbone groove and a ring of the compressed lubricating oil is formed in the circumference direction. Thus, the shaft floats off the bearing, and accordingly can be rotated at high speed.

Conventionally, in order to form a herringbone groove constituting the dynamic pressure bearing on the inner surface, an electrode shaped in accordance with the herringbone is formed, and a herringbone groove is formed by transferring the electrode by an electrolytic chemical process, electric discharge process or the like.

Alternatively, a herringbone groove is formed on the inner surface by utilizing spring-back used when applying sizing to a sintered material.

When forming a herringbone groove on the inner surface of the bearing by transferring the electrode by an electrolytic process, spark cutter or the like, an object to be processed is not masked, and also the electrode wears. In this case, if attempting to deepen the groove, the groove also becomes wide. Therefore, it is difficult to set up optimal electrolytic conditions and discharge conditions for that purpose, which is one of its problems.

In the method utilizing spring-back used when applying sizing, since it is difficult to form a groove on an iron-family material by spring-back, the material is limited to a copper-family material with a fairly large modulus of elasticity, and only a shallow groove 3~4 μm deep can be formed. Besides, if a copper-family material is used, the bearing is damaged by its touching with the shaft at the time of its starting and stoppage, which is another problem.

Alternatively, a herringbone groove can be formed by machining (cutting, forming by rolling, etc.).

However, in the case of cutting, it is difficult to process a material hard to cut, such as highly hard stainless steel, etc., and the life of used tools is reduced, which is another problem. In order to improve process accuracy, tools and using conditions must be managed. Furthermore, since cutting causes burrs, the burrs must be removed.

In the case of forming by rolling, it is also difficult to process a material hard to cut, such as highly hard stainless steel, etc. In order to improve process accuracy, tools and using conditions must also be managed. Since in the case of forming by rolling, swell occurs on the crest part of the groove due to plastic deformation, the swell must be corrected.

SUMMARY OF THE INVENTION

It is an object of the present invention to easily form a dynamic pressure generating groove, such as a herringbone groove, a spiral groove and the like, on the inner surface of a bearing.

The dynamic pressure bearing manufacturing method of the present invention comprises a step of forming resist on the inner surface of a bearing, a step of applying exposure to using a mask on which a dynamic pressure generating groove pattern is formed and transferring the dynamic pressure generating groove pattern of the mask onto the resist, a step of developing the transferred resist and a step of forming a dynamic pressure generating groove on the inner surface of the bearing by etching after developing the resist.

According to the present invention, a dynamic pressure generating groove can be formed on the inner surface of a bearing with high accuracy and in high speed.

In one aspect of the present invention, a first dynamic pressure generating groove pattern is formed on the outer peripheral surface, and exposure is simultaneously applied to both the first dynamic pressure generating groove pattern and a second dynamic pressure generating groove pattern, using a mask on the side surface of which the second dynamic pressure generating groove pattern is formed.

As described above, since the first and second dynamic pressure generating groove patterns can be simultaneously transferred to a bearing by exposure, time needed for an exposure process can be reduced. A first dynamic pressure generating groove is formed on a surface parallel to the center axis of a shaft inserted in the bearing, and a second dynamic pressure generating groove is formed on a surface opposing to a surface intersecting with the center axis.

In another aspect of the present invention, a herringbone groove pattern is formed on the cylindrical or cylindroid outer peripheral surface, and exposure is simultaneously applied to both the herringbone groove pattern on the inner surface of the bearing and a spiral groove pattern on the side surface, using a mask on the flange part of which the spiral groove pattern is formed.

As described above, since the herringbone groove pattern on the inner surface of the bearing and spiral groove pattern on the side surface can be simultaneously transferred by exposure, exposure time can be reduced.

The present invention further comprises a step of inserting a cylindrical mask on which a dynamic pressure generating groove is formed in the bearing. In this case, a light guiding material is inserted in the hollow part inside the cylindrical mask, and exposure is applied by guiding light from an external light source to the inside of the mask through the light guiding material.

As described above, since exposure can be applied by inserting a light guiding material, such as an optical fiber or the like in the hollow part of the mask, this method can also be applied to a bearing with a small diameter.

In this dynamic pressure bearing manufacturing method using the cylindrical mask, an optical fiber is used as a light guiding material, the optical fiber is inserted in the hollow part of the mask, and exposure is applied by guiding light from an external light source through the optical fiber.

In another aspect of the present invention, a cylindroid mask made of transparent material is inserted in the bearing, and exposure is applied by inputting excitation light to the end part of the mask and making the cylindroid mask emit light.

As described above, since the mask itself can be used as an exposure light source, an exposure mechanism can be simplified.

In another aspect of the present invention, an optical fiber whose end part is slantingly cut is inserted in the bearing, and exposure is applied by rotating the optical fiber and also shifting it in the axis direction.

As described above, since exposure can be applied using an optical fiber and an external light source, an exposure mechanism for inserting the optical fiber in the bearing can be simplified.

The dynamic pressure generating groove formed on the inner or on the side surface of the bearing is, for example, a herringbone groove or a spiral groove. The resist is, for example, photo-sensitive resist.

After coating resist on the inner or side surface of the bearing, the mask is inserted in the bearing. After the pattern of the inserted mask is exposed and transferred to the resist, a herringbone groove or spiral groove can be formed on the inner surface of the bearing by developing the resist, applying etching to the bearing, and removing the resist.

Exposure is, for example, applied while radiating light guided to the hollow part inside the cylindrical mask through the optical fiber to the resist coated on the inner surface of the bearing, rotating the optical fiber on the circumference and shifting the optical fiber in the axis direction.

Thus, a herringbone groove and a spiral groove can be formed on the inner and side surfaces, respectively, of a bearing with high accuracy and efficiency.

BRIEF DESCRIPTION OF THE DRAWINGS

FIGS. 1A and 1B show the structure of the dynamic pressure bearing in this preferred embodiment;

FIG. 2 is a flowchart showing the manufacturing process of the dynamic pressure bearing in the preferred embodiment;

FIGS. 3A and 3B show the structure of a cylindroid mask;

FIGS. 4A and 4B show the structure of the dynamic pressure beating using the cylindroid mask;

FIG. 5 shows the structure of a spindle motor;

FIG. 11 shows the structure of the exposure unit FIGS. 12A and 12B show one shape of the mask;

FIGS. 13A and 13B show another shape of the mask;

FIG. 14 shows another shape of the mask;

FIG. 15 shows the structure of the dynamic pressure bearing;

FIG. 16 explains how to manufacture the mask;

FIG. 18 explains how to manufacture the mask;

FIG. 19 explains how to manufacture the mask;

FIG. 23 explains the etching process;

FIG. 25 explains the etching process;

FIG. 29 shows a jig used for the exposure process;

DESCRIPTION OF THE PREFERRED EMBODIMENTS

Figure 6:
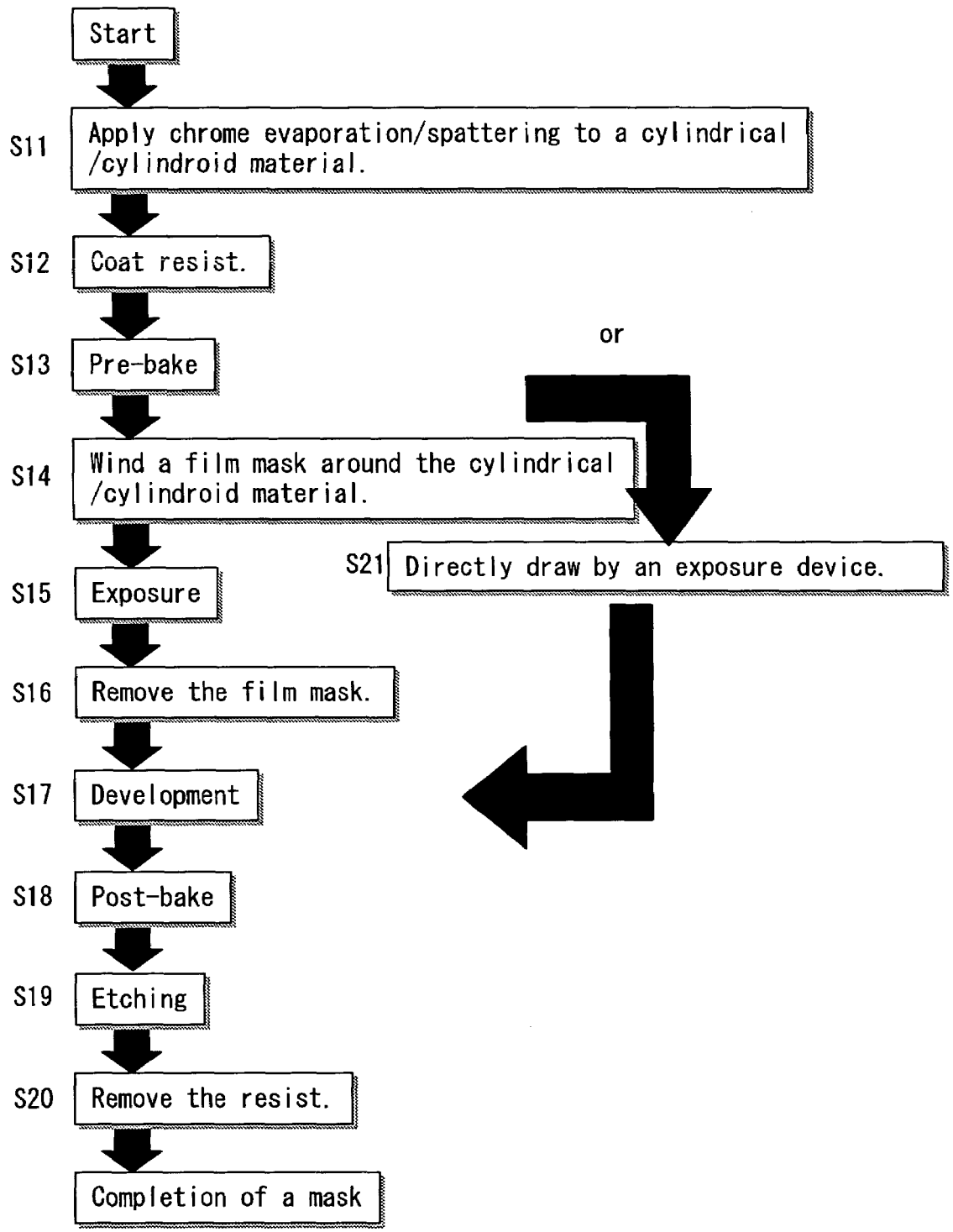
FIG. 6 is a flowchart showing the manufacturing process of the mask in the preferred embodiment.

The preferred embodiments of the present invention are described below with reference to the drawings.

FIGS. 1A and 1B show the structure of the dynamic pressure bearing of the present invention. FIG. 1A is the top view of a dynamic pressure bearing 2. FIG. 1A shows a spiral groove 22 provided on the top surface of the dynamic pressure bearing 2.

FIG. 1B is the section view of the dynamic pressure bearing 2. In FIG. 1B, a mask 1 is cylindrical or cylindroid, and the pattern of a herringbone groove 21 and that of a spiral groove 22 are formed on its outer and side surfaces, respectively.

For a material for the mask 1, glass, quartz or a highly transparent resin material, such as acryl, poly-carbonate, poly-ester, PET (poly-ethylene terephtalate) or the like can be used. For the mask 1, a transparent sheet can also be used.

For a material for the dynamic pressure bearing 2, an iron-family material, such a stainless steel, etc., an aluminum-family material, a copper-family material, such as brass, phosphoric bronze, etc., a resin material, such as PPS (poly-phenylene sulfide), poly-acetal, poly-amide-family synthetic resin, polyethylene, etc., ceramic or plated materials thereof or the like can be used.

In the case of the cylindrical mask 1 shown in FIG. 1, an optical fiber 4 with a prism at the tip as shown in FIG. 1 is inserted, the optical fiber 4 is rotated and shifted in the axis direction by a mechanism, which is not shown in FIG. 1, and the pattern of a herringbone groove 21 (for example, a pattern obtained by applying chrome plating and removing only a part corresponding to the herringbone groove 21) pre-formed on the outside of the mask 1 is transferred to a resist 3 by applying UV light from the inside. In this case, the spiral groove 22 can be simultaneously formed on the upper side surface of the dynamic pressure bearing 2 by applying UV (ultra-violet) light to the flange side (downward from the top in FIG. 1B).

The herringbone groove 21 and spiral groove 22 are formed on the inner and upper side surfaces, respectively, of the dynamic pressure bearing 2.

The resist 3 is coated on the inner and side surfaces of the dynamic pressure bearing 2 and is photo-sensitive.

The resist 3 is exposed to light radiated from the inside of the mask 1 through the optical fiber 4 (corresponding to light-guiding material). For example, a 45-degree prism is provided at the tip and the pattern of the mask 1 is transferred to the resist 3 by exposure. The pattern of the mask 1 can also be transferred to the resist 3 by inserting a light-emitting bar (discharge tube, etc.), instead of the optical fiber 4.

Next, FIG. 2 is a flowchart showing the manufacturing process of the dynamic pressure bearing. The process of forming both the herringbone groove 21 and spiral groove 22 on the dynamic pressure bearing 2 is described in detail below with reference to the flowchart shown in FIG. 2.

In step S1 of FIG. 2, the resist is coated. Specifically, the resist is coated on both a part on the inner surface of the dynamic pressure bearing 2 shown in FIG. 1 where the herringbone groove 21 should be formed, and a part on the side surface where the spiral groove 22 should be formed (for example, pouring a small amount of resist solution diluted by solvent after unnecessary materials are removed and the resist 3 is coated).

As a method for forming resist, a dip method of dipping a target object in a resist solution, a method of flowing the resist solution over a target object, a method of coating the resist solution on a target object by rotating the object, a method of spraying the resist solution over a target object, an electro-deposition method or the like is used.

In step S2, pre-bake is applied. Specifically, the target object is heated up to a predetermined temperature to evaporate solution in the resist coated in step S1.

Then, in step S3, the mask 1 is mounted. Specifically, a cylindrical or cylindroid mask 1 is inserted in the dynamic pressure bearing 2 on the inner and side surfaces of which the resist 3 is coated, as shown in FIG. 1.

Then, in step S4, exposure is applied. Specifically, the pattern of the mask 1 mounted inside the dynamic pressure bearing 2 in step S3 is transferred to the coated resist 3 by exposure. As shown in FIG. 1, the optical fiber 4 with a 45-degree prism on the tip is inserted in the hollow part of the cylindrical mask 1, and the pattern on the outer peripheral surface of the mask 1 is transferred to the resist 3 by exposure by shifting the optical fiber 4 in the axis direction while rotating it.

Then, in step S5, the mask 1 is removed. Then, in step S6, development is applied. Specifically, the respective patterns of both the herringbone groove 21 and spiral groove 22 are generated by developing the pattern transferred by exposure to the resist 3 shown in FIG. 1 (for example, developing the resist with sodium carbonate solution).

Then, in step S7, the target object is post-baked. Specifically, the target object is heated up to a predetermined temperature to remove both the solvent and water in the resist 3 and to improve its adhesion to the dynamic pressure bearing 2.

Then, in step S8, etching is applied. Specifically, etching is applied to the pattern part (without resist) formed on the inner and upper side surfaces of the dynamic pressure bearing 2 by the resist 3 (etched, for example, with ferric chloride) to form a pattern (herringbone groove 21 and spiral groove 22) with a predetermined depth.

As an etching method, chemical etching, such as dry etching (in vapor phase), wet etching, etc., electrolytic etching (electrochemical process)(electro-chemical process by energization in liquid phase) or the like can be used. As the dry etching, plasma etching can be used. For solution for wet etching, ferric chloride, phosphoric acid or the like can be used. For solution for electrolytic etching, sodium chloride, sodium nitrate or the like can be used.

Then, in step S9, the resist is removed. Specifically, the hardened resist is removed by using a stripping agent (for example, sodium hydroxide solution, organic solvent, etc.).

Thus, both the herringbone groove 21 and spiral groove 22 can be formed with high accuracy and efficiently by coating parts on which both the herringbone groove 21 and spiral groove 22 of the dynamic pressure bearing 2 should be formed, with the resist 3, inserting the cylindrical or cylindroid mask in the dynamic pressure bearing 2, applying exposure, development and etching, and removing hardened resist.

Alternatively, exposure can also be applied without using the mask 1, exposure light source on the surface of which the herringbone grove pattern 12 and the like is directly drawn can also be inserted in the dynamic pressure bearing 2.

Next, FIGS. 3A and 3B show the shape of the mask 1 in the preferred embodiment. FIGS. 3A and 3B show an example of the transparent (for example, glass) cylindroid mask 1.

FIG. 3A shows the part of the spiral groove pattern 11 shown in FIG. 3B, and FIG. 3B is its side section view.

In FIG. 3A, a spiral groove pattern 11 is formed on the part 11 (formed on the lower surface of the flange part 1a) shown in FIG. 3B and is a mask pattern to be transferred to the spiral groove 22 of the dynamic pressure bearing 2 shown in FIG. 1.

As described earlier, the mask pattern is generated by removing only the masked pattern part after applying chrome plating over the entire surface.

In FIG. 3B, a herringbone groove pattern 12 is the mask pattern to be transferred to the herringbone groove 21 of the dynamic pressure bearing shown in FIG. 1.

As described above, the transparent (glass) cylindroid mask 1, on the outer peripheral surface and side surface of which the herringbone groove pattern 12 and the spiral groove pattern 11 are generated in advance, is prepared.

Next, FIG. 4 shows the structure of another dynamic pressure beating 2 using the cylindroid mask (corresponding to light-guiding material) shown in FIG. 3. FIG. 4A shows the appearance of the spiral groove 22 of the dynamic pressure bearing 2. FIG. 4A shows the part 22 shown in FIG. 4B.

FIG. 4B is the side section view of the dynamic pressure bearing 2. In this example, since the cylindroid mask 1 shown in FIG. 3 is inserted in the dynamic pressure bearing 2, and excitation light (for example, UV light) is radiated from the top, the entire transparent cylindroid mask 1 emits light by luminescence, and the mask pattern on the outer peripheral surface of the lit cylindroid mask 1 is transferred by exposure to the resist 3 coated on the inner surface of the dynamic pressure bearing 2 at one time. Simultaneously, the spiral groove pattern 11 is transferred by exposure to the resist 3 coated on the upper side surface.

As described above, by inserting the transparent cylindroid mask 1 which emits light when excitation light, such as luminescence or the like, is radiated, in the dynamic pressure bearing 2, the respective patterns corresponding to both the herringbone groove 21 and spiral groove 22 can be transferred by exposure to the resist 3 simultaneously.

FIG. 5 shows the structure of a spindle motor using the dynamic pressure bearing 2 of the present invention.

The dynamic pressure bearing 2 shown in FIG. 5 is the above-mentioned one. A rotary shaft 5 is inserted in the dynamic pressure bearing 2 and is rotated. The herringbone groove 21 and spiral groove 22 are provided in the respective positions shown in FIG. 5.

FIG. 6 is a flowchart showing the manufacturing process of the mask 1. In step S11 of FIG. 6, chrome evaporation (or sputtering) is applied to a cylindrical/cylindroid transparent glass or quartz material, and in step S12, resist coating is applied. Furthermore, in step S13, pre-bake is applied.

Then, in step S14, a film mask is wound around the cylindrical/cylindroid material, and in step S15, exposure is applied. In step S16, the film mask is removed, and in step S17, development is applied.

In step S18, post-bake is applied. Then, in step S19, etching is applied, and in step S20, the resist is removed. Thus, a mask is completed.

Alternatively, a pattern can also be directly drawn by an exposure device (drawn by exposure while rotating a cylindrical/cylindroid mask without using a film mask (step S21 of FIG. 6).

Similarly, a mask for the spiral groove pattern 11 is generated by exposure by attaching a ring-shaped film to a cylindrical/cylindroid flange part.

Thus, the mask 1 can be generated.

Next, FIGS. 7 through 11 show examples of the structure of the exposure unit.

Figure 7:
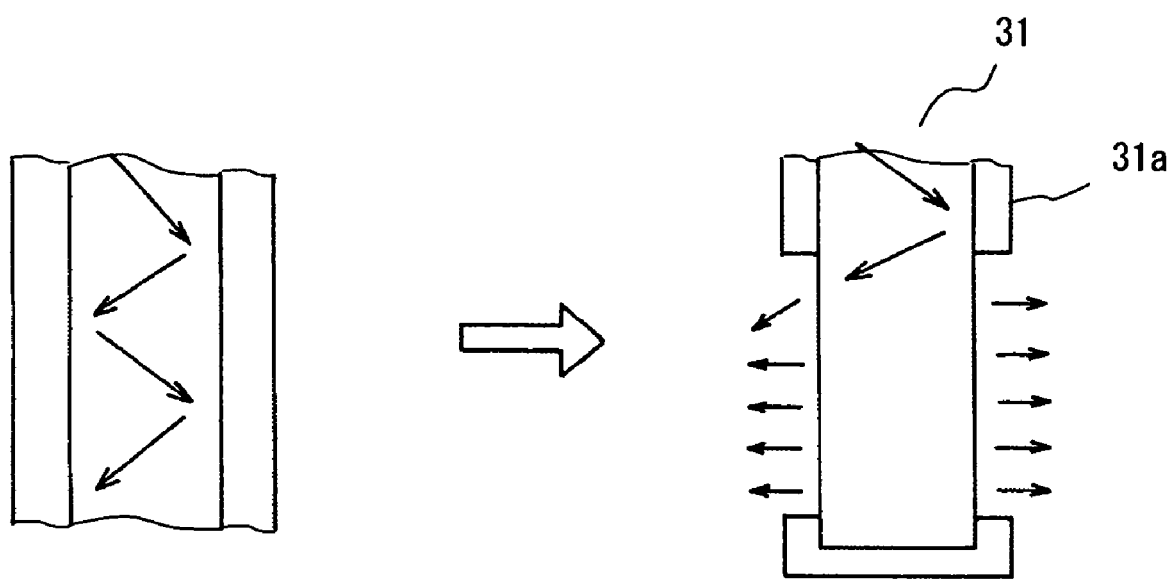
FIG. 7 shows the structure of an optical fiber.

FIG. 7 shows the structure of the exposure unit in which the clad layer 31a of the outer peripheral part of the optical fiber 31 is removed and light is radiated from the side of the optical fiber 31. In this case, since UV light can be guided from an external light source or the like to the inside of the mask 1 through the optical fiber, exposure can be applied without rotating the optical fiber 31 or axially shifting it.

Figure 8:
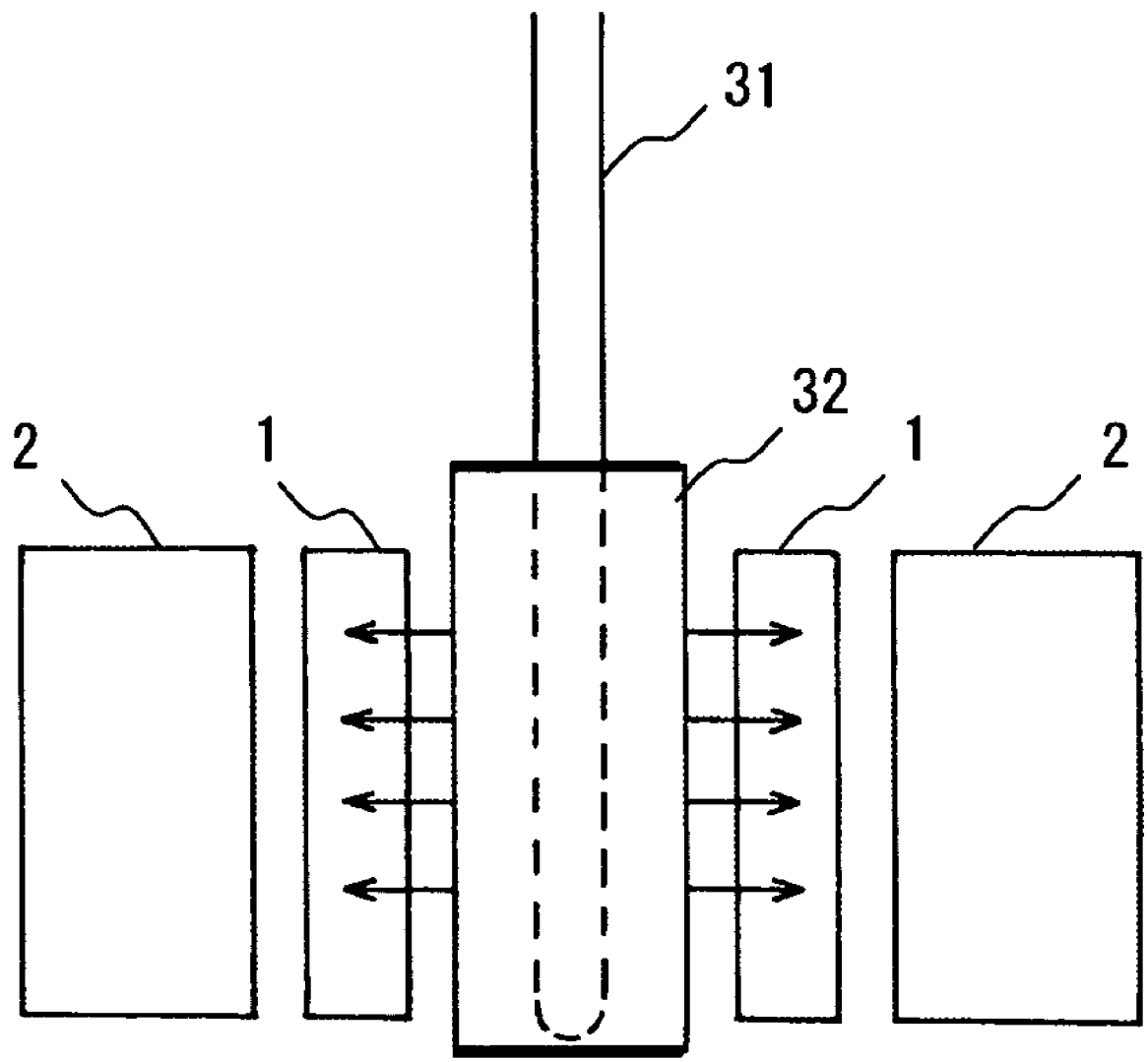
FIG. 8 shows the structure of the exposure unit.

FIG. 8 shows the structure of the exposure unit in which the optical fiber 31 is covered with a cylindrical glass 32 or the like, and both the upper and lower surfaces orthogonal to the axis of the glass 32 are masked with a reflective material to prevent light leakage in the axis direction of the optical fiber. In this case, since light that is radiated from the optical fiber 31 and is reflected on the upper and lower surfaces of the glass 32 is collected in the direction of the mask 1 (in the horizontal direction in FIG. 8), light from an external light source can be efficiently used for exposure.

Figure 9:
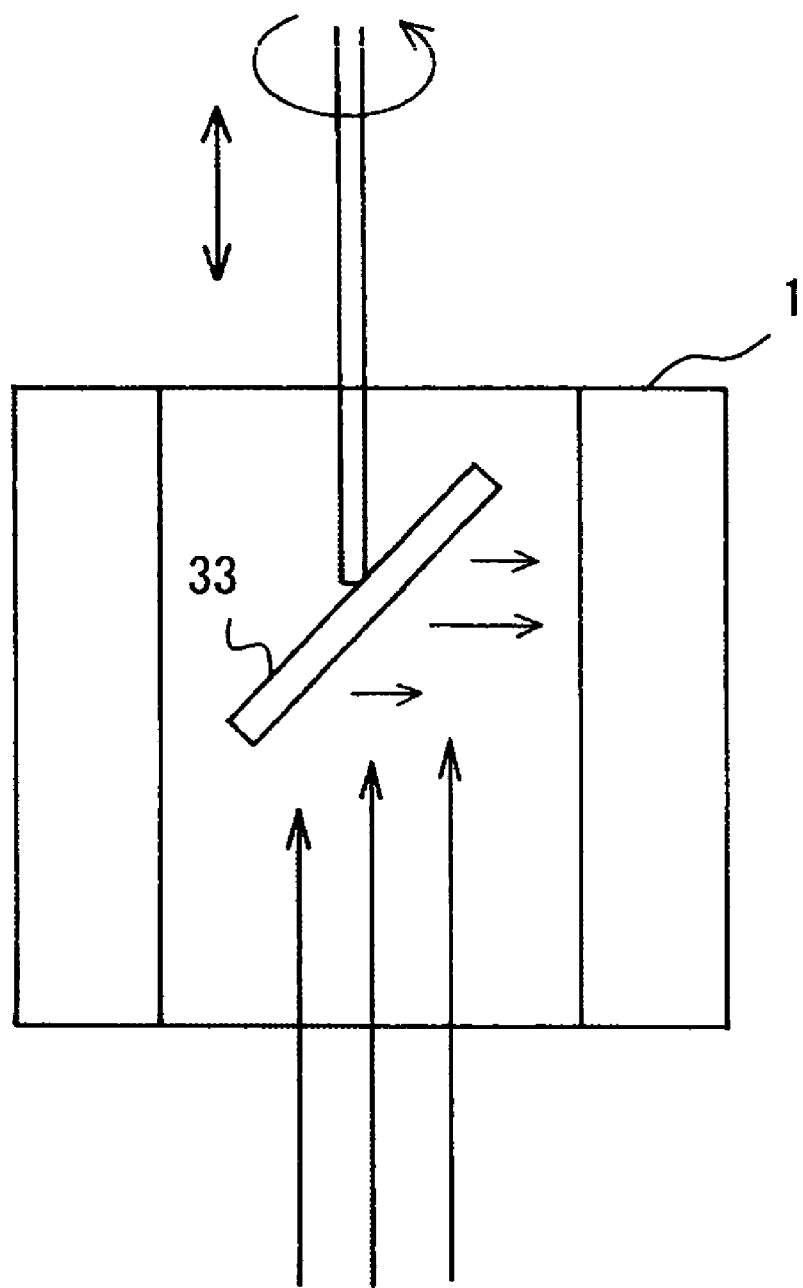
FIG. 9 shows the structure of the exposure unit.

In FIG. 9, a mirror 33 whose reflection surface is tilted by approximately 45 degrees is disposed inside the mask 1. In this case, in order to reflect light from an external light source on the mirror 33 and to radiate the entire inner peripheral surface, the mirror 33 must be rotated by 360 degrees and also be axially shifted.

Figure 10:
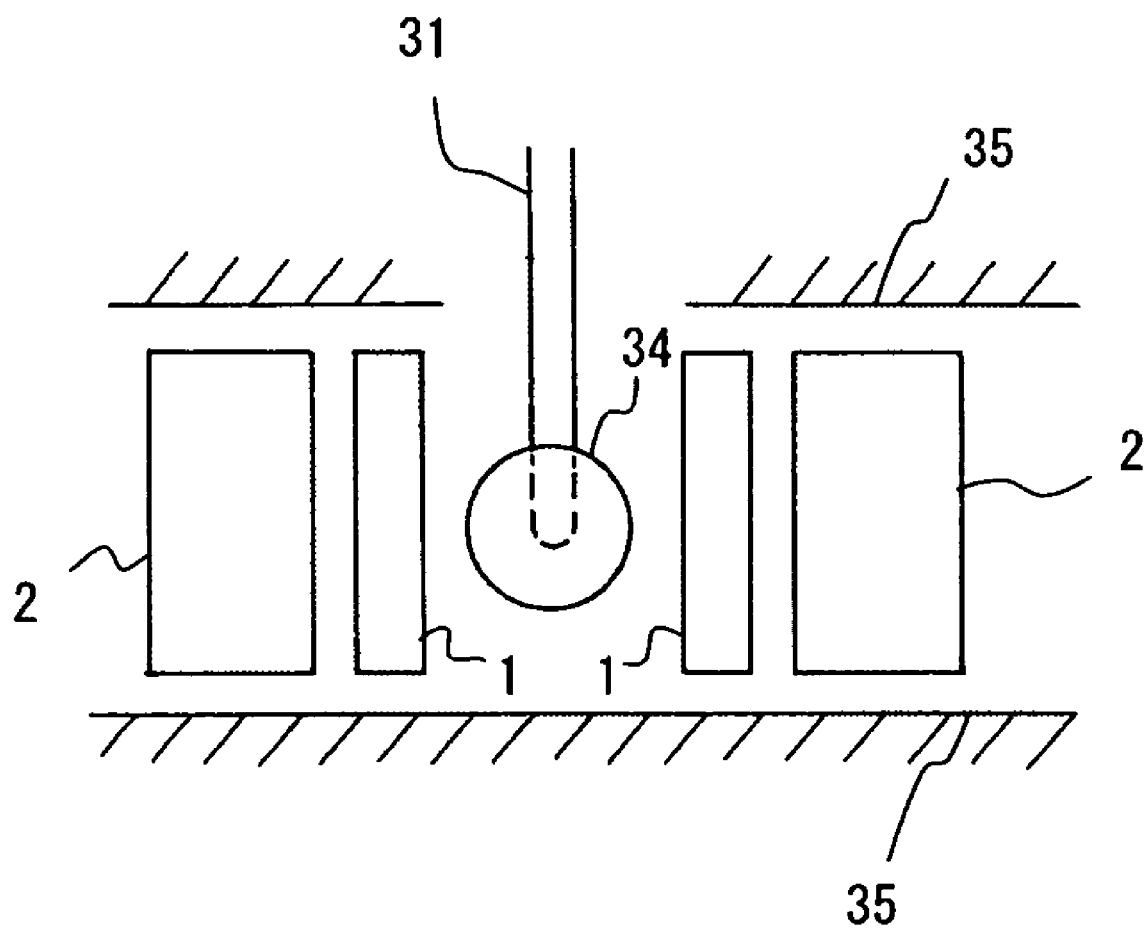
FIG. 10 shows the structure of the exposure unit.

In FIG. 10, light radiated from the optical fiber 31 is spread using a spherical spreading material 34. In this case, since light is spread by the spreading material 34, is radiated to the mask 1, and the light radiated from the spreading material 34 is also reflected by a reflection plate 35 and is inputted to the mask 1, there is no need to rotate the optical fiber 31 or to axially shift it. There is no need for the shape of the spreading material 34 to be spherical and it can be flat.

In FIG. 11, a reflection plate 36 reflecting light diffusely in the respective vicinity of the upper/lower surfaces of the mask 1 and dynamic pressure bearing 2 is provided. In this case, light inputted from the upper light source is reflected at random on the lower reflection plate 36 and is inputted. Simultaneously, light reflected diffusely on the lower reflection plate 36 is reflected at random on the upper reflection plate 36 and is inputted. As described above, by using the reflection plate 36, exposure can be applied with a simple structure, without using a light-guiding material, such as an optical fiber or the like.

Next, FIGS. 12 through 14 show the shapes of the mask.

In FIGS. 12A and 12B, the mask is cylindrical, and FIGS. 12A and 12B are the section views of a mask 41 without a flange and a mask 42 with a flange, respectively.

On the outer peripheral surface of the cylindrical mask 41 without a flange, the herringbone groove pattern 12 used to generate a herringbone groove is formed.

On the outer peripheral surface of the cylindrical mask 42 with a flange, similarly the herringbone groove pattern 12 used to generate a herringbone groove is formed, and on the lower surface of a flange part 42a, a spiral groove pattern 11 is formed.

The mask 41 is used when only the herringbone groove 21 is formed on the dynamic pressure bearing 2, and the mask 42 is used when the herringbone groove 21 and spiral groove 22 are simultaneously formed.

Next, in FIGS. 13A and 13B, the mask is cylindroid, and FIGS. 13A and 13B are the side views of a mask 43 without a flange and a mask 44 with a flange, respectively.

On the outer peripheral surface of the cylindroid mask 43 without a flange, the herringbone groove pattern 12 used to generate a herringbone groove is formed.

On the outer peripheral surface of the cylindroid mask 44 with a flange, similarly the herringbone groove pattern 12 is formed, and on the lower surface of a flange part 44a, a spiral groove pattern 11 is formed.

FIG. 14 shows both a mask used to manufacture a dynamic pressure bearing with a sloped surface and the dynamic pressure bearing 46.

As shown in FIG. 14, the diameter of the mask 45 decreases from the top toward the bottom in accordance with the shape of the dynamic pressure bearing 46, and the surface connecting the top and the bottom is tilted in a circular cone shape. The mask 45 is inserted in the dynamic pressure bearing 46, and the herringbone groove 21 is formed on its cylindrical and circular-conic inner surfaces of the mask 45. Although the mask 45 shown in FIG. 14 is hollow, it can also be solid as shown in FIG. 12B or 13B.

FIG. 15 is the section view of a dynamic pressure bearing 47 manufactured using the above-mentioned mask. Two rows of herringbone grooves 21 and no spiral groove 22 are formed on the dynamic pressure bearing 47 shown in FIG. 15.

Next, FIGS. 16 through 19 explain how to manufacture the mask.

Figure 17:
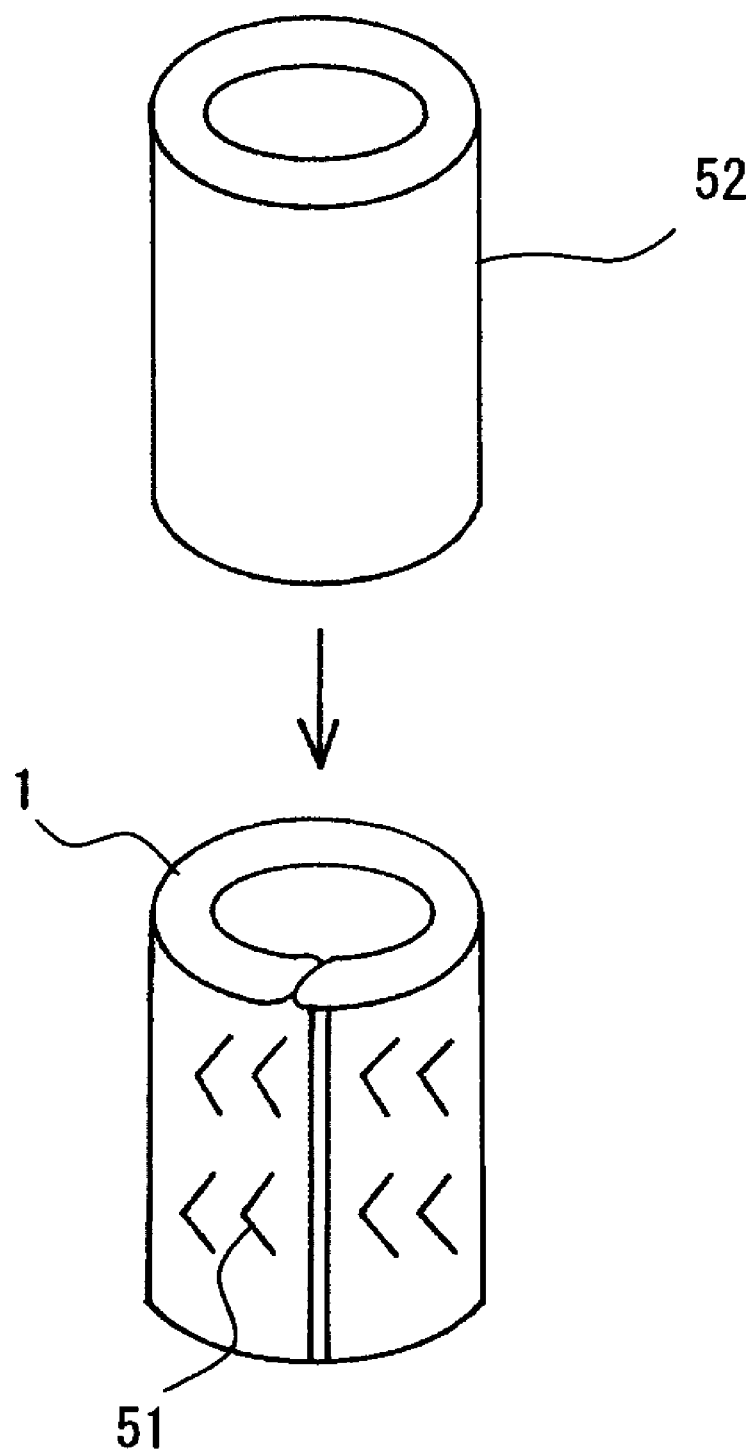
FIG. 17 explains how to manufacture the mask.

FIGS. 16 and 17 explain how to wind a film mask 51 around the mask 1 on which the resist 3 is already formed and how to manufacture the mask by photo-lithography.

The resist 3 is formed on the outer peripheral surface of the cylindrical mask 1 made of a transparent material, such as glass or the like, and a film mask 51 on which the herringbone groove pattern 12 is printed is wound around on the surface of the resist 3.

Then, as shown in FIG. 17, a hollow cylindrical guide 52 made of a transparent material, such as glass or the like, is put around the outside of the mask 1 and is fixed so that the film mask 51 may not come off. Then, by a normal photo-lithography process, the herringbone groove pattern 12 is transferred to the resist 3 by radiating light to the film mask 51 and is formed on the outer peripheral surface of the mask 1 by developing the resist 3. Thus, a cylindrical mask 1 is formed.

FIG. 18 shows the end surface of the film mask used to manufacture the mask 1 that is cut along the herringbone groove pattern 12. If the end surface of a film mask 53 is cut along the herringbone groove pattern 12, when the film mask 53 is wound around the mask 1, the ends of the film mask 53 are butted at the joint making it difficult for the film mask 53 to come off.

Next, FIG. 19 explains how to form the herringbone groove pattern 12 by inserting the mask 1 into a cylindrical master mask 54.

The master mask 54 is made of a transparent material, such as glass or the like, and is cylindrical. The herringbone groove pattern 12 is formed on its outer peripheral surface.

When manufacturing the mask 1, firstly a resist, which is not shown in FIG. 19, is formed on the outer peripheral surface of the mask 1 by electro-deposition or the like, and the mask 1 on which the resist is formed is inserted in the hollow part of the master mask 54. Then, the herringbone groove pattern 12 is transferred to the mask 1 by radiating UV light to the outer peripheral surface of the master mask 54 and is formed on the outer peripheral surface by developing the resist. Thus, the same herringbone groove pattern 12 as the master mask 54 is formed on the outer peripheral surface of the mask 1.

Figure 20:
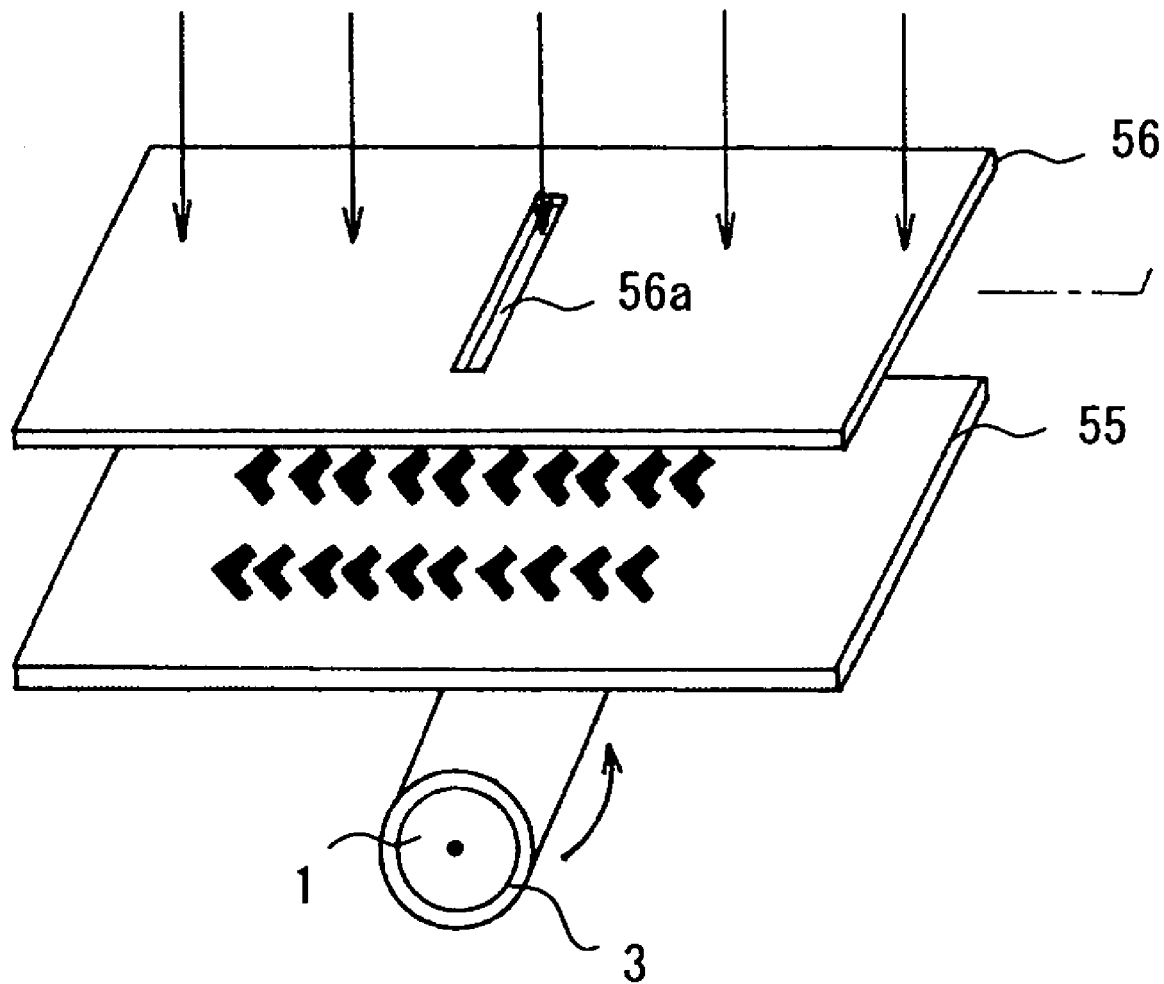
FIG. 20 explains how to manufacture the mask.

Next, FIG. 20 explains how to manufacture the mask 1 using a flat master mask 55.

The master mask 55 is made of a transparent material, such as glass or the like, and is flat. A film on which the herringbone groove pattern 12 is formed or the like is pasted on its surface.

A plate 56 with a slit 56a on its surface is provided above the master mask 55, and light is radiated to the plate 56 from the light source placed above. The plate 56 is made of a material that does not transmit light, and only light that travels through the slit 56 is inputted to the master mask 55. The light that travels through the slit 56a is radiated to the herringbone groove pattern 12 of the master mask 55 placed under the slit 56a, and the resist 3 placed under the herringbone groove pattern 12 is exposed to light. If the master mask 55 is shifted leftward in FIG. 20, the mask 1 rotates counter-clockwise and the herringbone groove pattern 12 under the slit 56a then is consecutively transferred to the mask 1. Thus, the herringbone groove pattern 12 formed on the master mask 55 is transferred to the mask 1, and the mask 1 needed to manufacture the dynamic pressure bearing 2 is generated.

Figure 21:
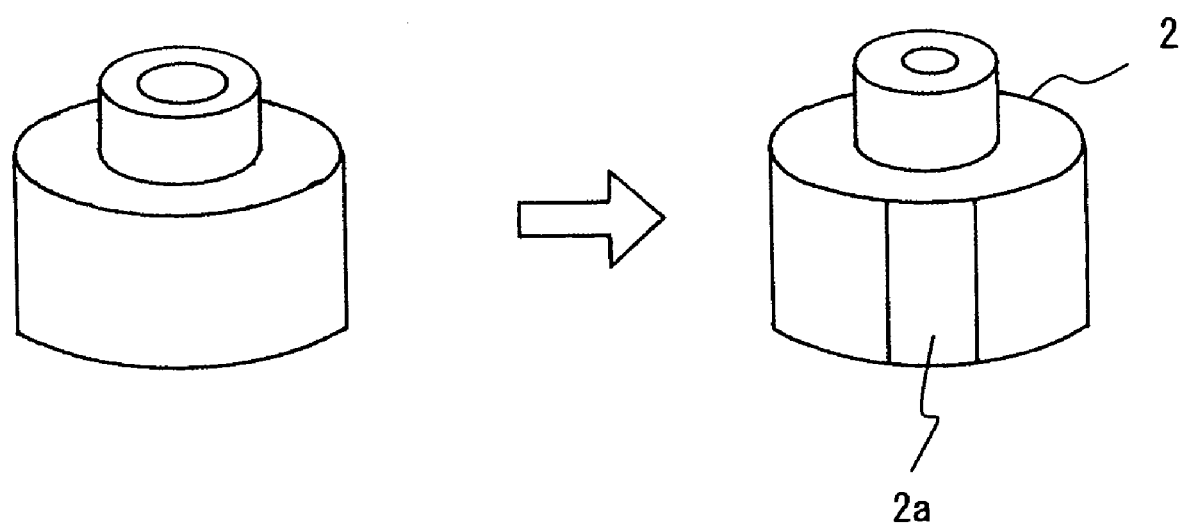
FIG. 21 shows the clamp unit of the bearing.

Next, FIG. 21 shows an example of the flat part 2a for clamp, set on the side surface of the dynamic pressure bearing 2 when forming resist on the dynamic pressure bearing 2 by electro-deposition. The flat part 2a is also provided on the rear side of the dynamic pressure beating 2 shown in FIG. 21. By clamping two flat parts 2a with metallic electrodes and applying voltage, the resist is formed.

By providing a part to which an electrodes is attached in a part that does not affect its bearing function, of the dynamic pressure bearing 2, the operability of an electro-deposition resist process can be improved.

Next, FIGS. 22 through 27 explain the etching process.

Figure 22:
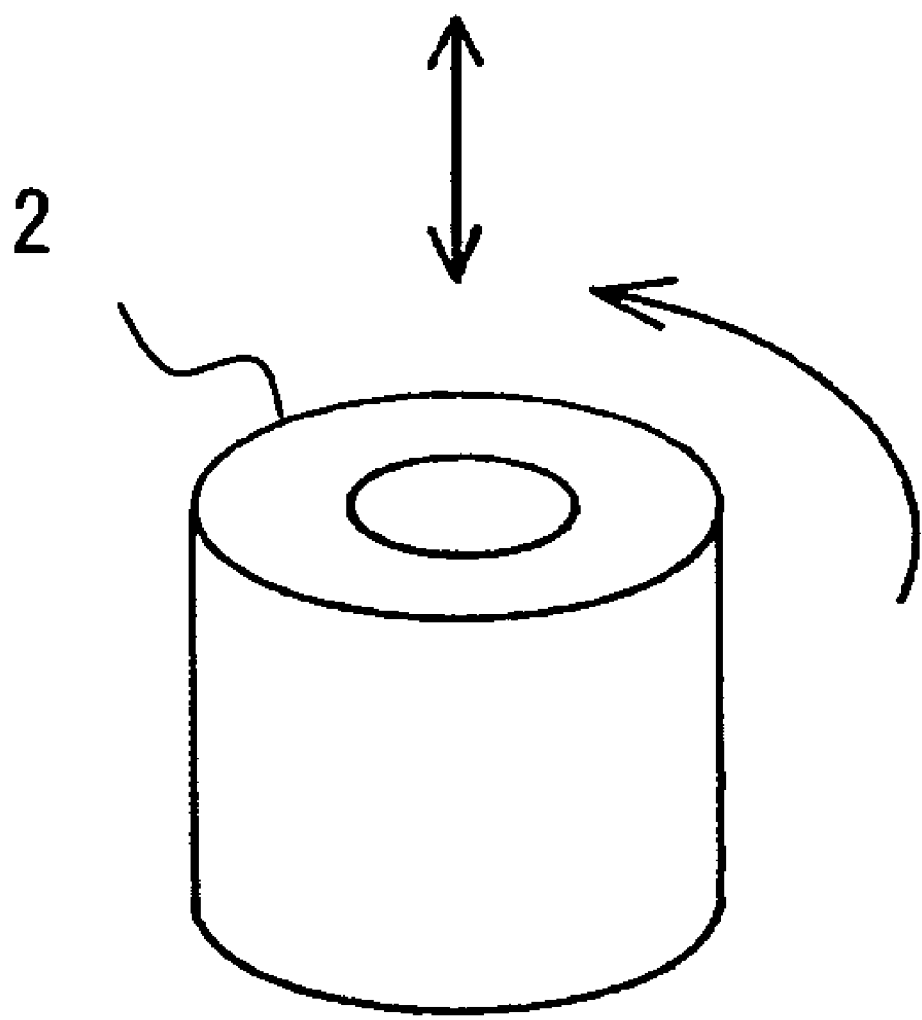
FIG. 22 explains the etching process.

FIG. 22 shows an example of how to form the herringbone groove 21 and/or spiral groove 22 with a prescribed depth by rotating and vertically shifting an object (dynamic pressure bearing 2) to be processed in the etchant of ferric chloride or the like by photo-lithography.

According to a specific method for rotating and vertically shifting the dynamic pressure bearing 2 in the etchant, for example, as shown in FIG. 23, a groove 2b is formed, for example, on the outer peripheral surface which does not affect the function of the dynamic pressure bearing 2, the groove 2b is hooked to a hook 61 connected to a rotation/shift driving device, which is not shown in FIG. 23, and the hook 61 is rotated and vertically shifted by the rotation/shift driving device. Alternatively, the entire etchant bath can also be vibrated. Alternatively, the etchant can also be vibrated by supersonic wave vibration or the like.

As described above, since new etchant is always supplied to the inner surface of the dynamic pressure bearing 2 by rotating and vertically shifting the dynamic pressure bearing 2 in the etchant, the etching can be uniformly applied. Thus, the dimensional accuracy of the herringbone groove 21 formed by the etching can be improved.

Figure 24:
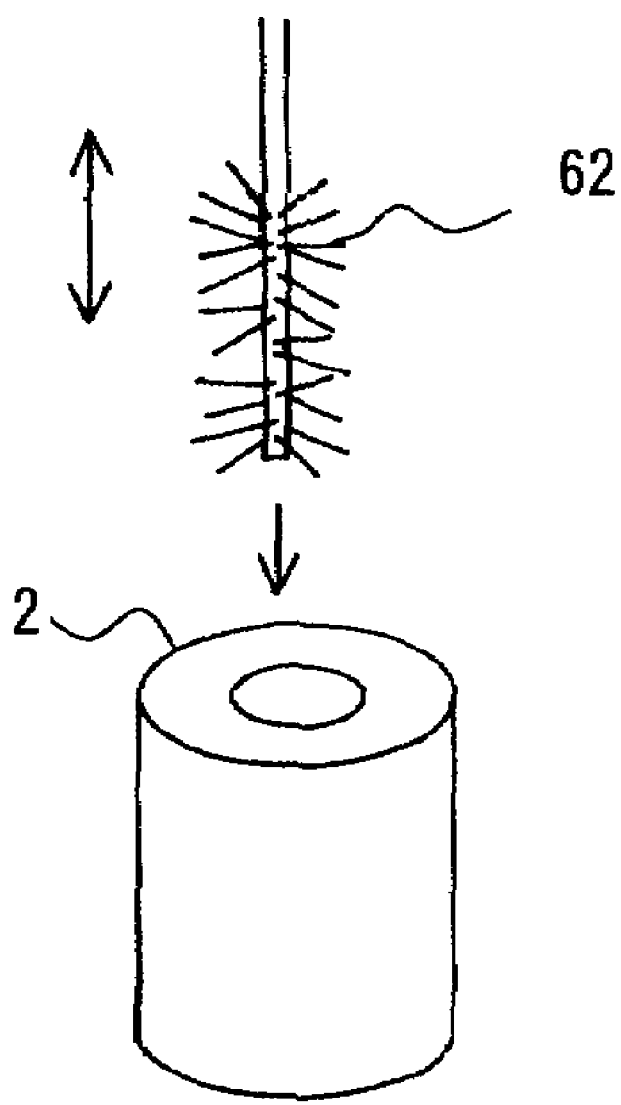
FIG. 24 explains the etching process.

FIGS. 24 and 25 show examples of etching by rubbing the inner surface of an object to be processed (dynamic pressure bearing 2) with a acid-proof rubbing material, such as a brush 62, sponge 63 or the like.

Figure 26:
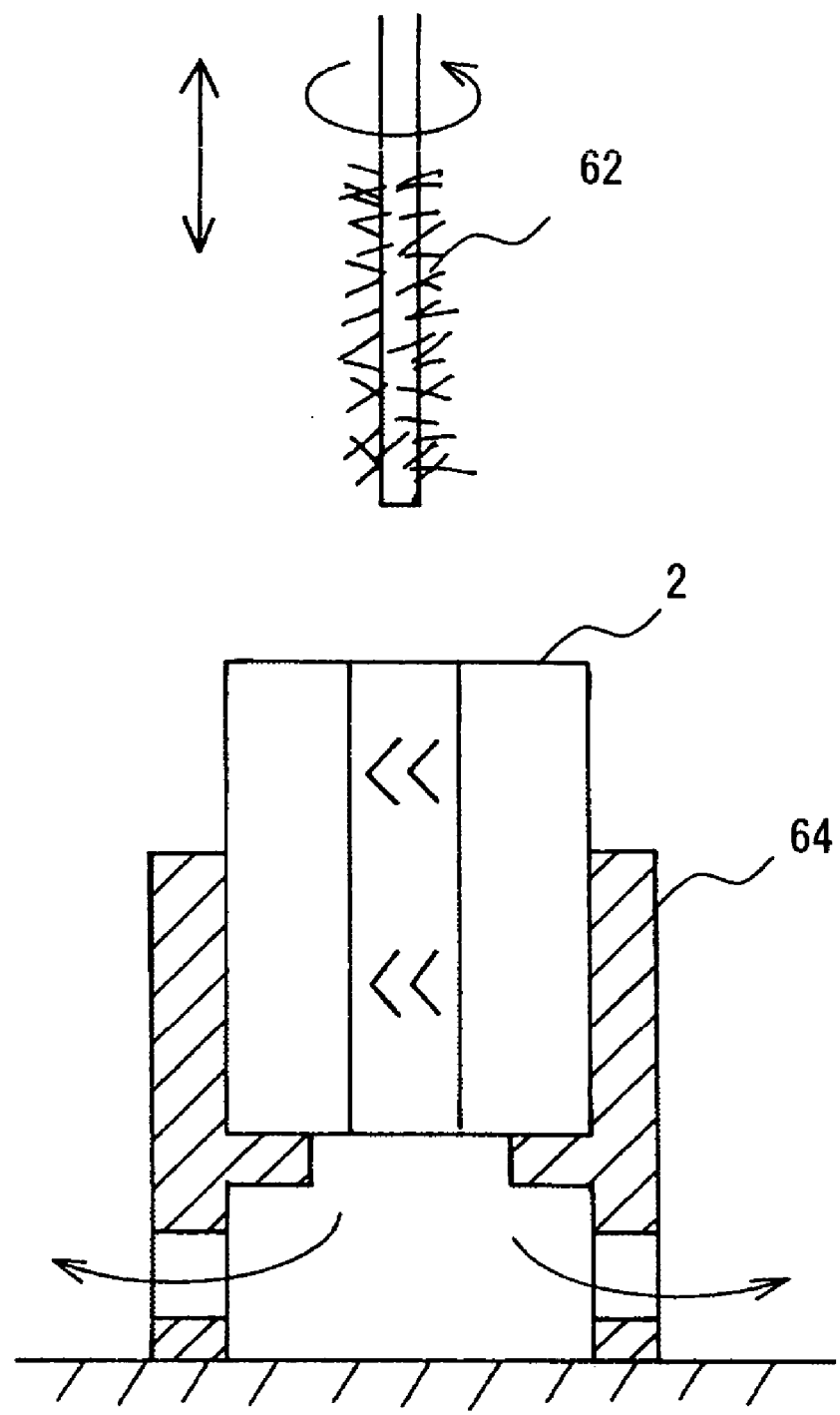
FIG. 26 explains the etching process.

According to a specific method for applying etching by rubbing the dynamic pressure bearing 2 with the brush 62 or sponge 63, for example, as shown in FIG. 26, the dynamic pressure bearing 2 is fixed on a jig 64 with some amount of weight and is dipped in the etchant. The brush 62 connected to the rotation/shift driving device, which is not shown in FIG. 24, is inserted on the inner peripheral surface of the dynamic pressure bearing 2 is rotated and axially shifted, and the inner peripheral surface of the dynamic pressure bearing 2 on which the herringbone groove 21 should be formed is rubbed. A hole is provided in the leg part of the jig 64, and the etchant pushed out of the dynamic pressure bearing 2 by the brush 62 is exhausted from the jig 64 and is recycled.

As described above, since by rubbing the etching surface of the dynamic pressure bearing 2 to be processed with a rubbing material, the etching surface is kept clean, the etchant is stirred up and new etchant is supplied on the inner surface of the dynamic pressure bearing 2. Therefore, the etching can be applied on uniform conditions. Thus, the dimensional accuracy of the herringbone groove 21 formed by the etching can be improved.

Figure 27:
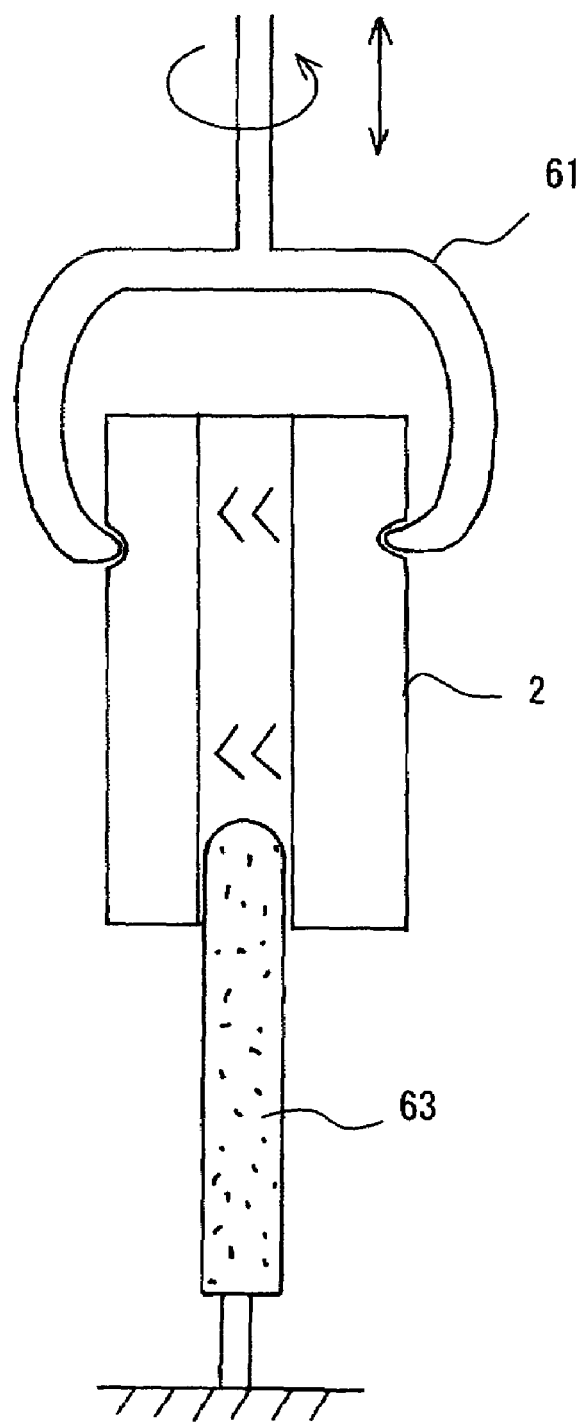
FIG. 27 explains the etching process.

In FIG. 27, different from FIG. 26, a rubbing material, such as a sponge 63 or the like is fixed in the etchant, the outer peripheral surface of the dynamic pressure bearing 2 is caught by the hook 61 connected to the rotation/shift driving device, and the dynamic pressure bearing 2 can be rotated and is axially shifted.

In this case, the same effect as described above can be obtained.

Next, FIGS. 28 through 31 show examples of a jig used to manufacture the dynamic pressure bearing 2.

Figure 28:
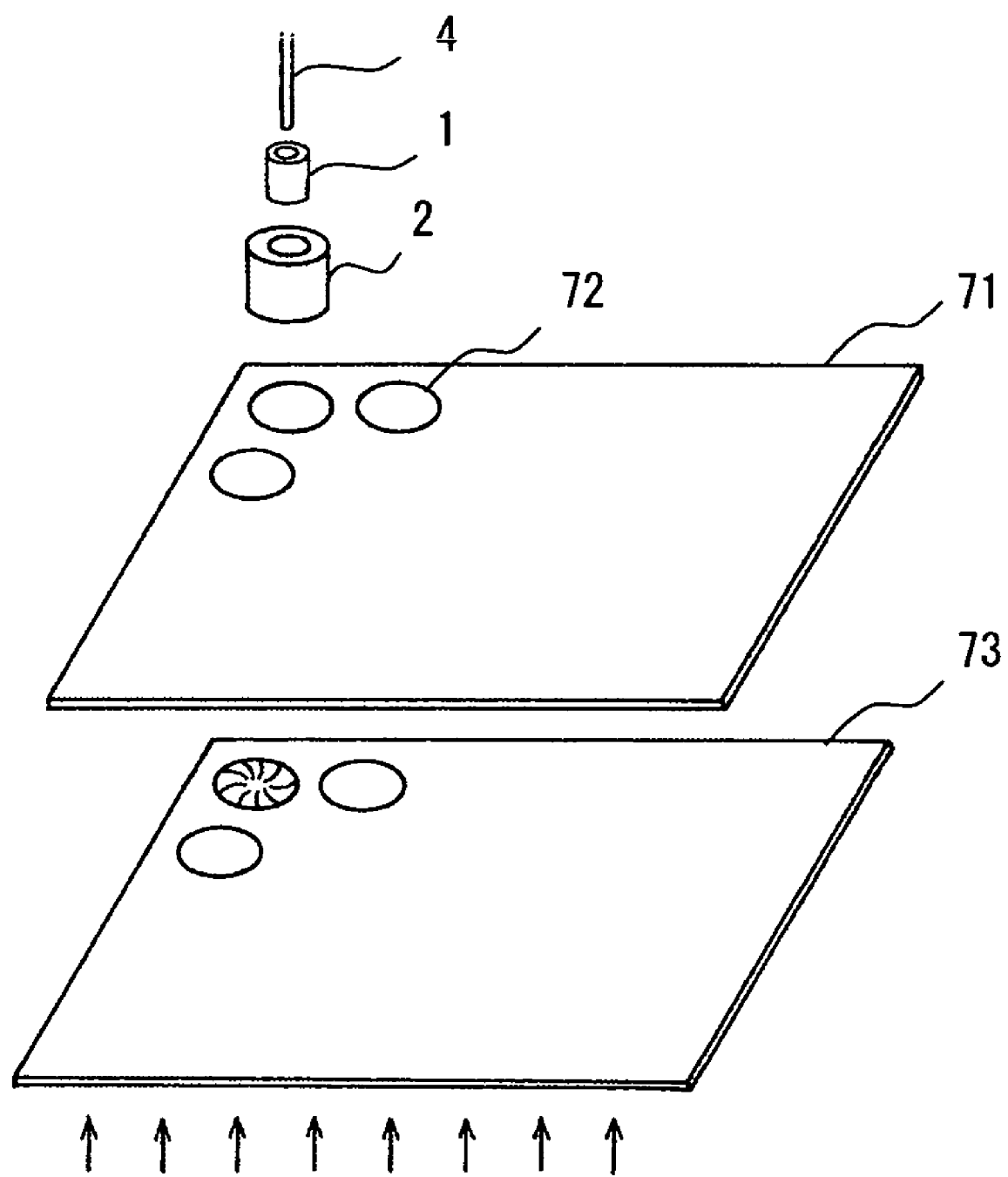
FIG. 28 shows a jig used for the exposure process.

FIGS. 28 and 29 show example of a jig used for the exposure process. In these examples, a plurality of dynamic pressure bearings 2 to be processed can be two-dimensionally arranged and be exposed.

As shown in FIG. 28, a jig 71 is provided with a plurality of holes 72 used to fix a plurality of dynamic pressure bearings 2. The pattern of the spiral groove 22 is formed of a jig 73 in the position corresponding to each hole 72 of the jig 71. This jig 73 functions as a mask used to form the spiral groove 22 on the lower surface of the plurality of dynamic pressure bearings 2.

If exposure is applied using the jigs 71 and 73, the jig 71 is placed above the jig 73, and each dynamic pressure bearing 2 is inserted in each hole of the jig 71. Then, the mask 1 on which the pattern of the herringbone groove 21 is formed is inserted in each dynamic pressure bearing 2, and the optical fiber 4 is inserted in the mask 1. Then, light is radiated from an external light source to the mask 1 through the optical fiber 4, and the herringbone groove pattern 12 is transferred onto the resist of the inner peripheral surface of the dynamic pressure bearing 2. Simultaneously, light is radiated from a light source placed under the jig 73, and the spiral groove pattern 11 formed on the jig 73 is transferred to the lower surface of the dynamic pressure bearing 2.

By using the jigs 71 and 73, exposure can be simultaneously applied to a plurality of dynamic pressure bearings 2. Furthermore, both the herringbone groove pattern 12 and spiral groove pattern 11 can be simultaneously transferred by one time of exposure.

Next, FIG. 29 shows an example of the structure where the mask 1 is fixed on a jig 74. As shown in FIG. 29, the jig 74 is provided with a plurality of masks 1 on each of which both the herringbone groove pattern 12 and spiral groove pattern 11 are formed. The spiral groove pattern 11 is formed in a position opposing to the lower surface of the dynamic pressure bearing 2 above the jig 74. Furthermore, a through-hole is provided so that the jig 74 may not touch the optical fiber 4 inserted in the hollow part of the mask 1. A jig 75 is provided with a plurality of optical fibers 4 so as to be able to be rotated.

If exposure is applied using the jigs 74 and 75, a plurality of dynamic pressure bearings 2 are inserted in the mask 1. Then, the optical fiber 4 attached to the jig 75 is inserted in each dynamic pressure bearing 2. Then, light from an external light source is inputted to each optical fiber 4, the optical fiber 4 is rotated by a driving device, which is not shown in FIG. 29, by vertically shifting the jig 75 and exposure light is radiated to the inner surface of the mask 1. Simultaneously, the spiral groove pattern 11 is transferred onto the lower surface of the dynamic pressure bearing 2 by radiating exposure light from the bottom of the jig 74. Thus, the herringbone groove pattern 12 and spiral groove pattern 11 are transferred onto the inner and side surfaces, respectively, of the dynamic pressure bearing 2.

Since both the herringbone groove pattern 12 and spiral groove pattern 11 can be simultaneously transferred to a plurality of objects, by using the jigs shown in FIGS. 28 and 29, exposure process time can be reduced.

Figure 30:
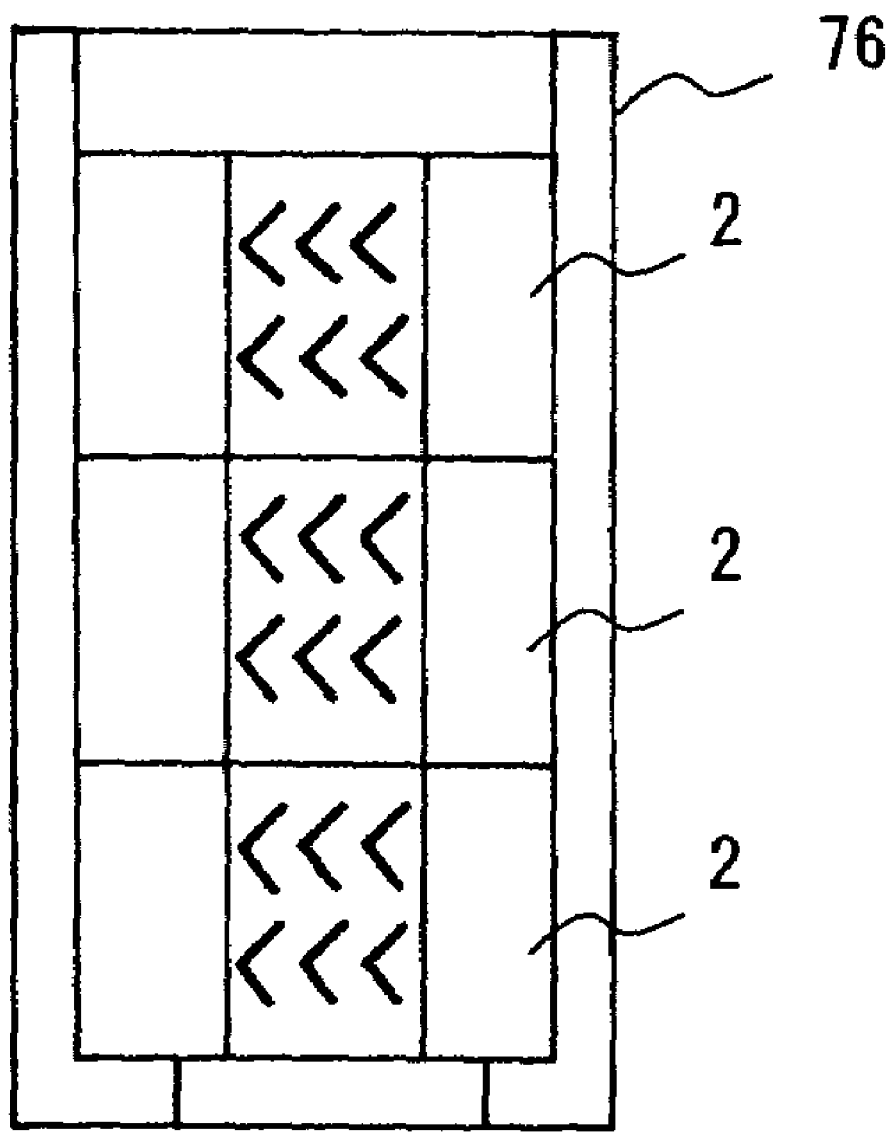
FIG. 30 shows a jig used for the development/etching processes.
Figure 31:
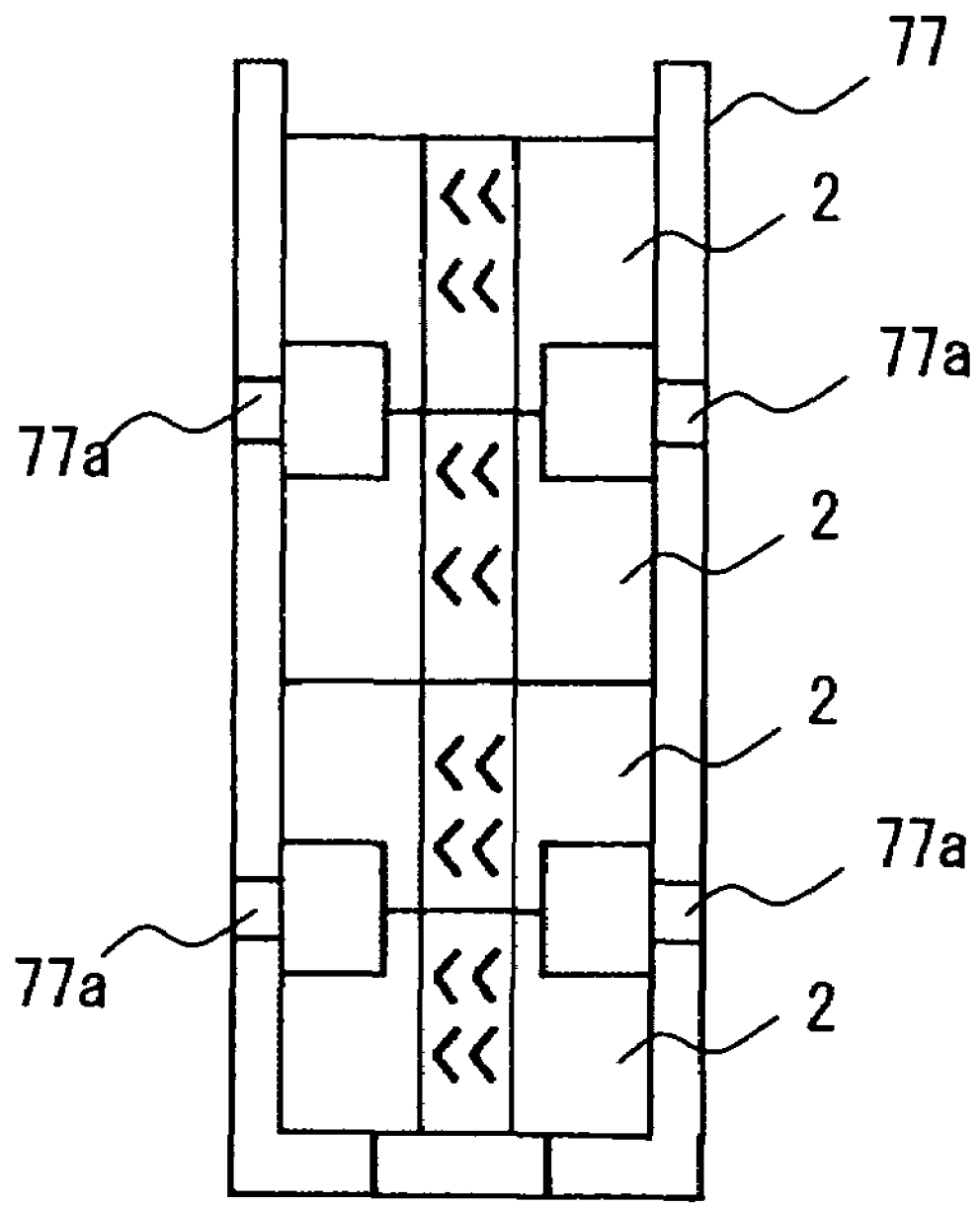
FIG. 31 shows a jig used for the development/etching processes.

Next, FIGS. 30 and 31 show examples of a jig used to simultaneously process a plurality of objects to be processed in the development/etching processes.

As shown in FIG. 30, a jig 76 has a cylindrical shape with an inner diameter a little larger than the outer diameter of the dynamic pressure bearing 2, and has a capacity sufficient to accommodate a plurality of dynamic pressure bearings 2. When applying development or etching, the plurality of dynamic pressure bearings 2 are sequentially piled up in the axis direction and are accommodated in the jig 76, and the development and etching can be simultaneously applied to the plurality of dynamic pressure bearings 2.

FIG. 31 shows the structure of a jig 77 used to form the spiral groove 22 on the side surface of the dynamic pressure bearing 2 together with the herringbone groove 21.

A hole 77a is provided on the side surface of the jig 77. This hole 77a is provided in such a way that the etchant may come onto the upper and lower surfaces of the dynamic pressure bearing 2 when the plurality of dynamic pressure bearings 2 are sequentially piled up in the axis direction and are accommodated in the jig 77.

As shown in FIG. 31, the plurality of dynamic pressure bearings 2 is accommodated in the jig 77 in such a way that surfaces on each of which the spiral groove 22 is formed oppose each other. When dipping the jig 77 in the etchant, the etchant comes round on the upper and lower surfaces of each dynamic pressure bearing 2 from the hole 77a, and the herringbone groove 21 and spiral groove 22 are simultaneously formed on its inner and upper/lower side surfaces, respectively.

As described above, both development and etching can be simultaneously applied to a plurality of dynamic pressure bearings 2 using both the jigs 76 and 77.

Although in the above preferred embodiments, the herringbone groove 21 and spiral groove 22 are formed, the dynamic pressure generating groove is not limited to the above-mentioned grooves.

According to the present invention, a resist can be formed on the a bearing, and a dynamic pressure generating groove, such as a herringbone groove and a spiral groove, can be formed efficiently and with high accuracy by applying exposure, development and etching. Since a dynamic pressure generating groove is formed by transfer and etching, the degree of freedom in groove pattern design can be also improved. Furthermore, since exposure is applied using a mask on which a pattern used to form dynamic pressure generating grooves both on its outer peripheral and side surfaces is formed, the dynamic pressure generating grooves can be simultaneously formed on both the inner and side surfaces of a bearing.

What is claimed is:

1. A method of manufacturing one or more grooves in a bearing, the method comprising:
    forming a resist on the inner surface of the bearing;
    inserting a mask on which at least one dynamic pressure generating groove pattern is formed;
    applying exposure and transferring the dynamic pressure generating groove pattern of the mask to the resist;
    developing the resist;
    etching a transferred dynamic pressure groove pattern on the bearing; and
    removing the resist;
    wherein the mask is made of transparent material;
    a first dynamic pressure generating groove pattern is formed on a cylindrical or conical outer peripheral surface of the mask, and a second dynamic pressure generating groove pattern is formed on a flange part of the mask; and
    the mask is inserted in the bearing, a light-guiding material is inserted in the cylindrical or conical mask, and exposure is applied by guiding light from an external light source to the inside of the bearing through the light-guiding material.

* * * * *